United States Patent [19]

Ogura

[11] Patent Number: 5,113,212
[45] Date of Patent: May 12, 1992

[54] METHOD FOR THE FORMATION OF IMAGES AND AN APPARATUS FOR PERFORMING THE SAME

[75] Inventor: Mitsuru Ogura, Nara, Japan

[73] Assignee: Sharp Kabushiki Kaisha, Osaka, Japan

[21] Appl. No.: 409,439

[22] Filed: Sep. 19, 1989

[30] Foreign Application Priority Data

Sep. 22, 1988 [JP] Japan .................. 63-238171

[51] Int. Cl.⁵ ................ G03B 27/04; G03B 27/32
[52] U.S. Cl. ......................... 355/27; 118/620; 355/100; 430/138
[58] Field of Search ............... 118/620, 76, 77; 361/214, 221; 354/86, 87; 156/238; 430/138, 256; 355/27, 100

[56] References Cited

U.S. PATENT DOCUMENTS

| | | | |
|---|---|---|---|
| 3,757,164 | 9/1973 | Binkowski | 361/221 |
| 4,307,432 | 12/1981 | Nishikawa | 361/214 |
| 4,695,143 | 9/1987 | Oshikoshi et al. | 354/86 |
| 4,842,976 | 6/1989 | Sanders et al. | 430/138 |
| 4,933,705 | 6/1990 | Nakata et al. | 355/27 |
| 4,965,622 | 10/1990 | Ibuchi | 355/27 |

FOREIGN PATENT DOCUMENTS 58-88739  5/1983  Japan .
1-20773   1/1989  Japan .

*Primary Examiner*—Michael G. Wityshyn
*Attorney, Agent, or Firm*—Morrison & Foerster

[57] ABSTRACT

A method and an apparatus for the formation of images are disclosed. The method utilizes a photosensitive sheet on which image-forming areas are successively allocated. The image-forming areas are successively transported into a light-exposure section to be subjected to entire surface exposure and then into a buffer section to be temporarily stored there. Then, the storage image-forming areas are successively transported into a pressure-transfer section to be subjected to a pressure-transfer process while one of the subsequent image-forming areas is subjected to the entire surface exposure at the light-exposure section. The apparatus includes transport rollers for transporting the photosensitive sheet. The transport rollers are so located that they come into contact with the intermediate areas between the image-forming areas of the photosensitive sheet when one of the image-forming areas remains stationary at the light-exposure section to be subjected to the entire surface exposure.

4 Claims, 16 Drawing Sheets

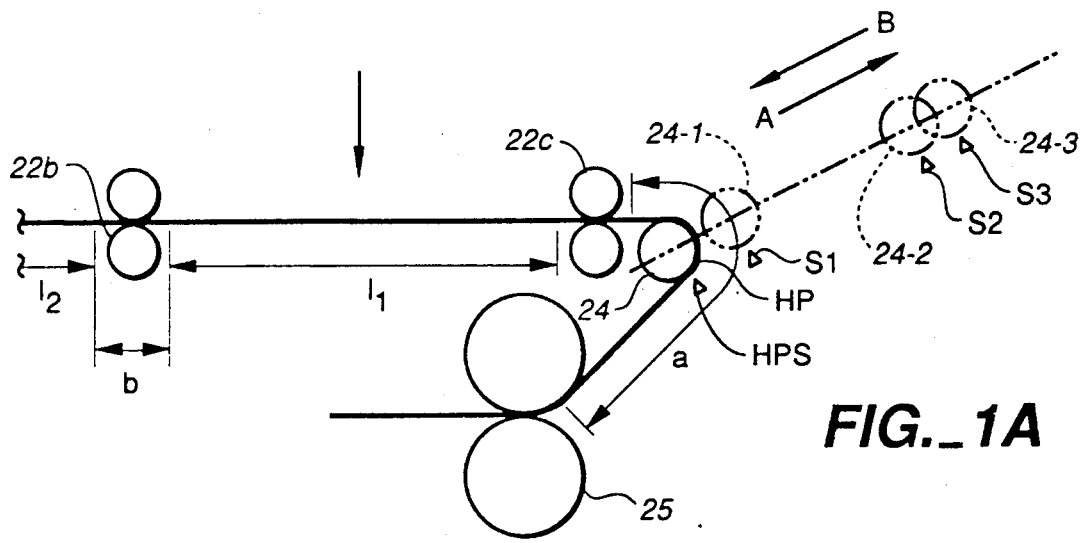
FIG._1A
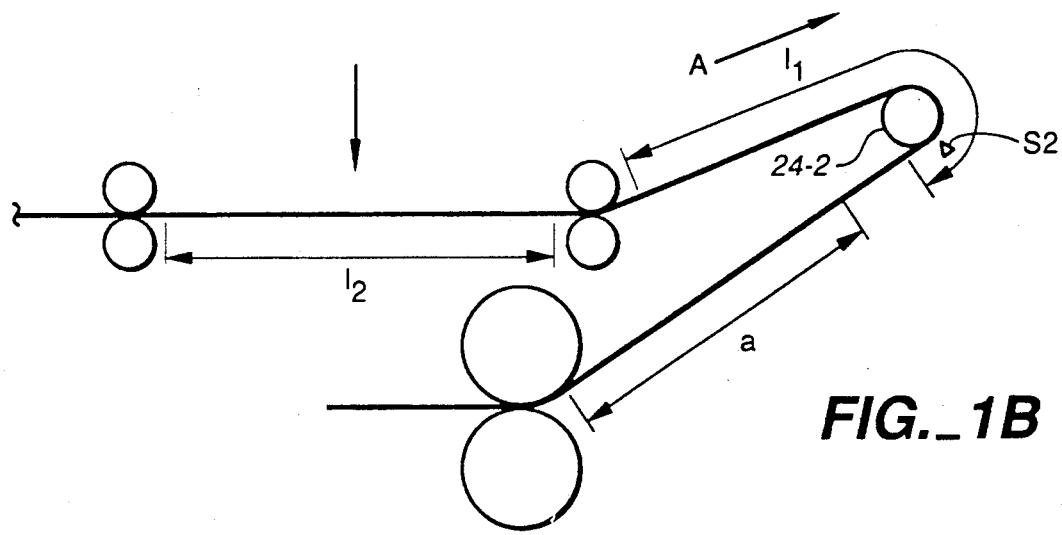
FIG._1B
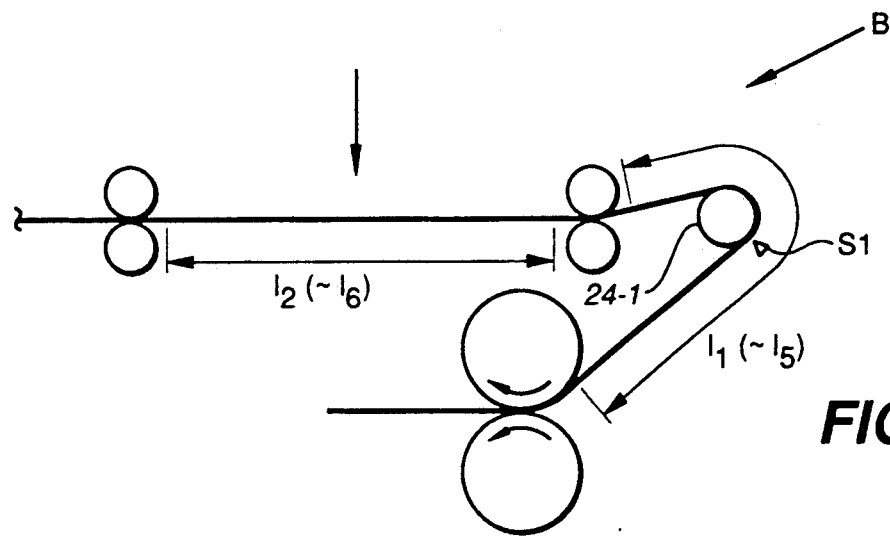
FIG._1C

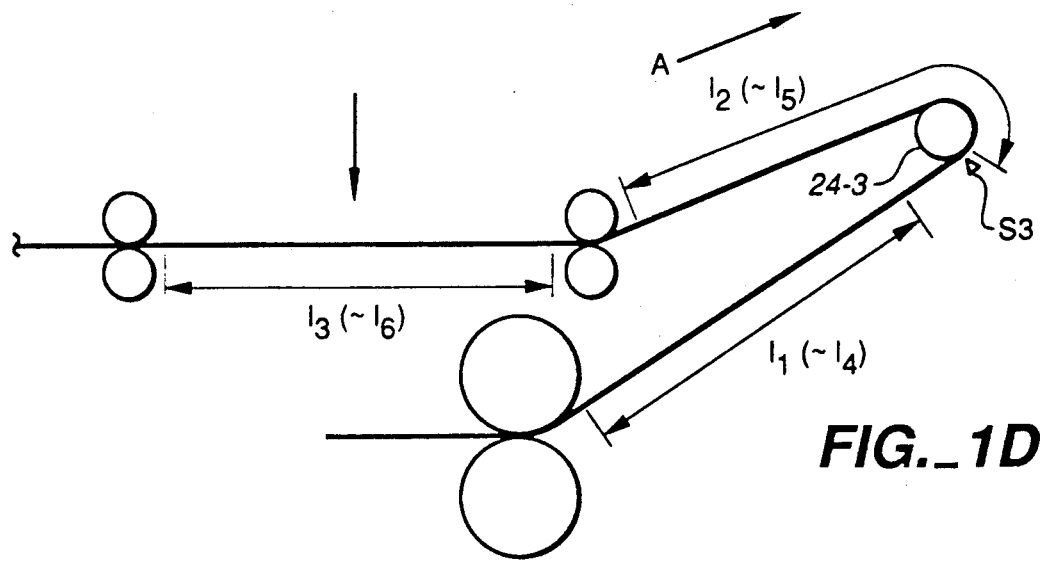
FIG._1D
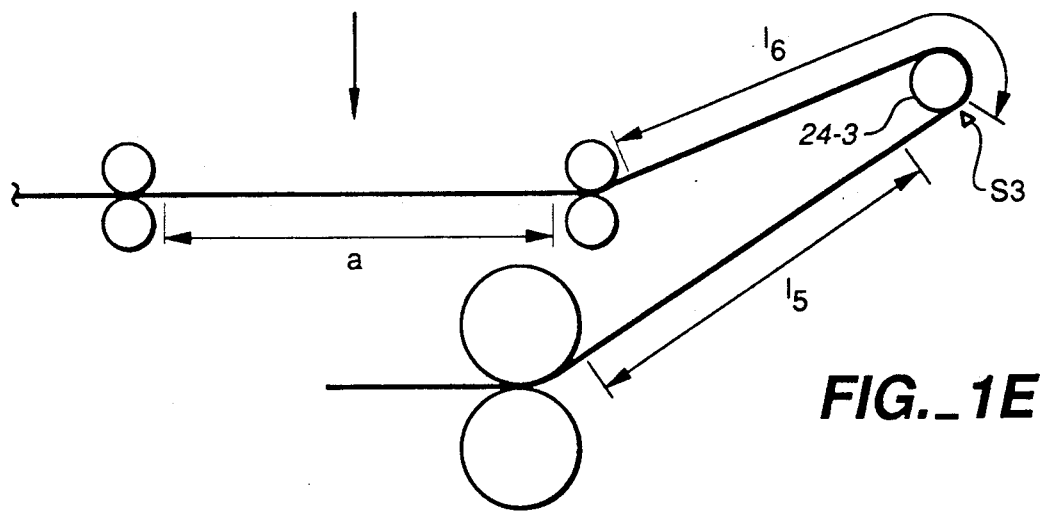
FIG._1E
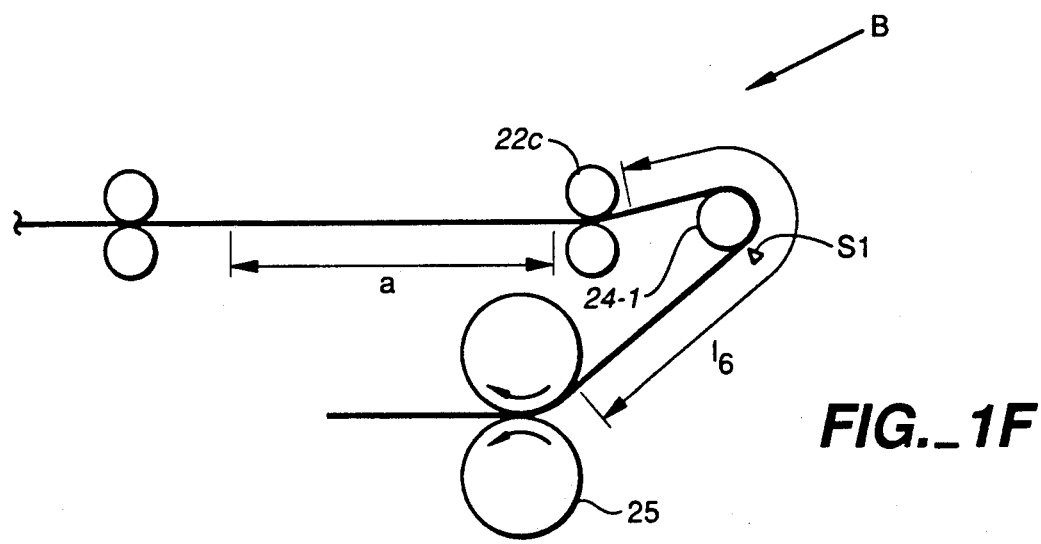
FIG._1F

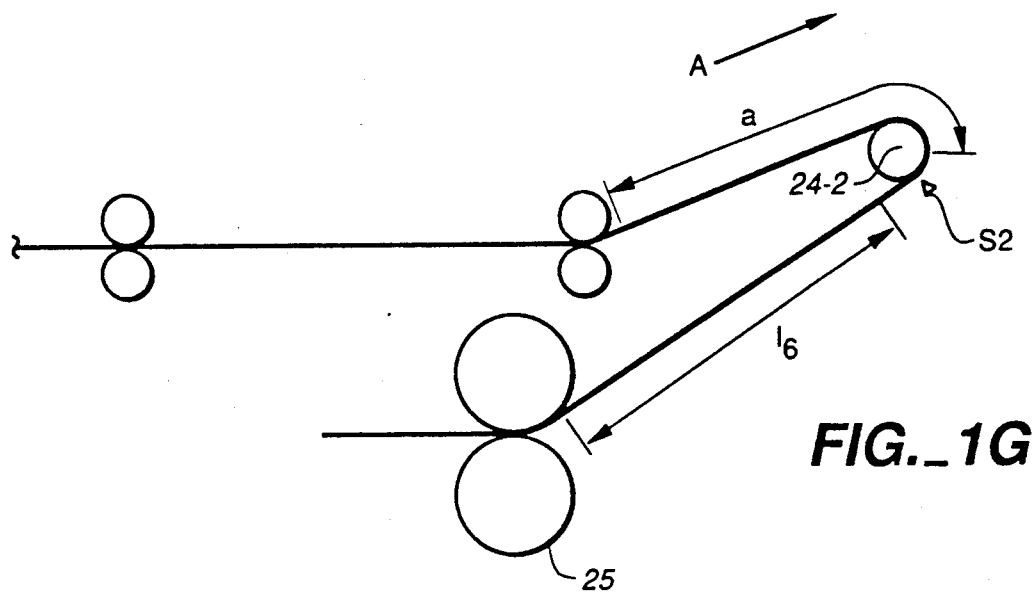
FIG._1G
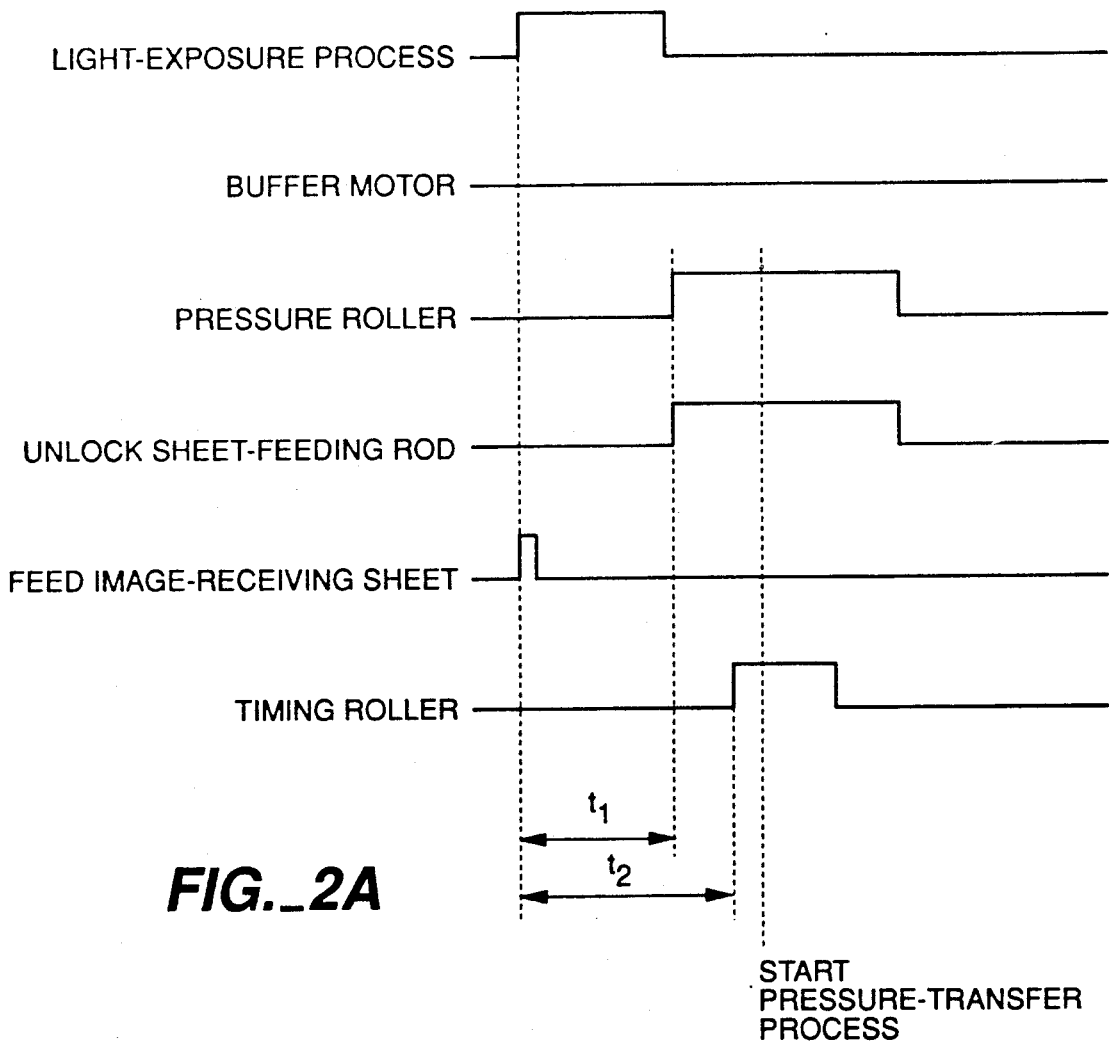
FIG._2A

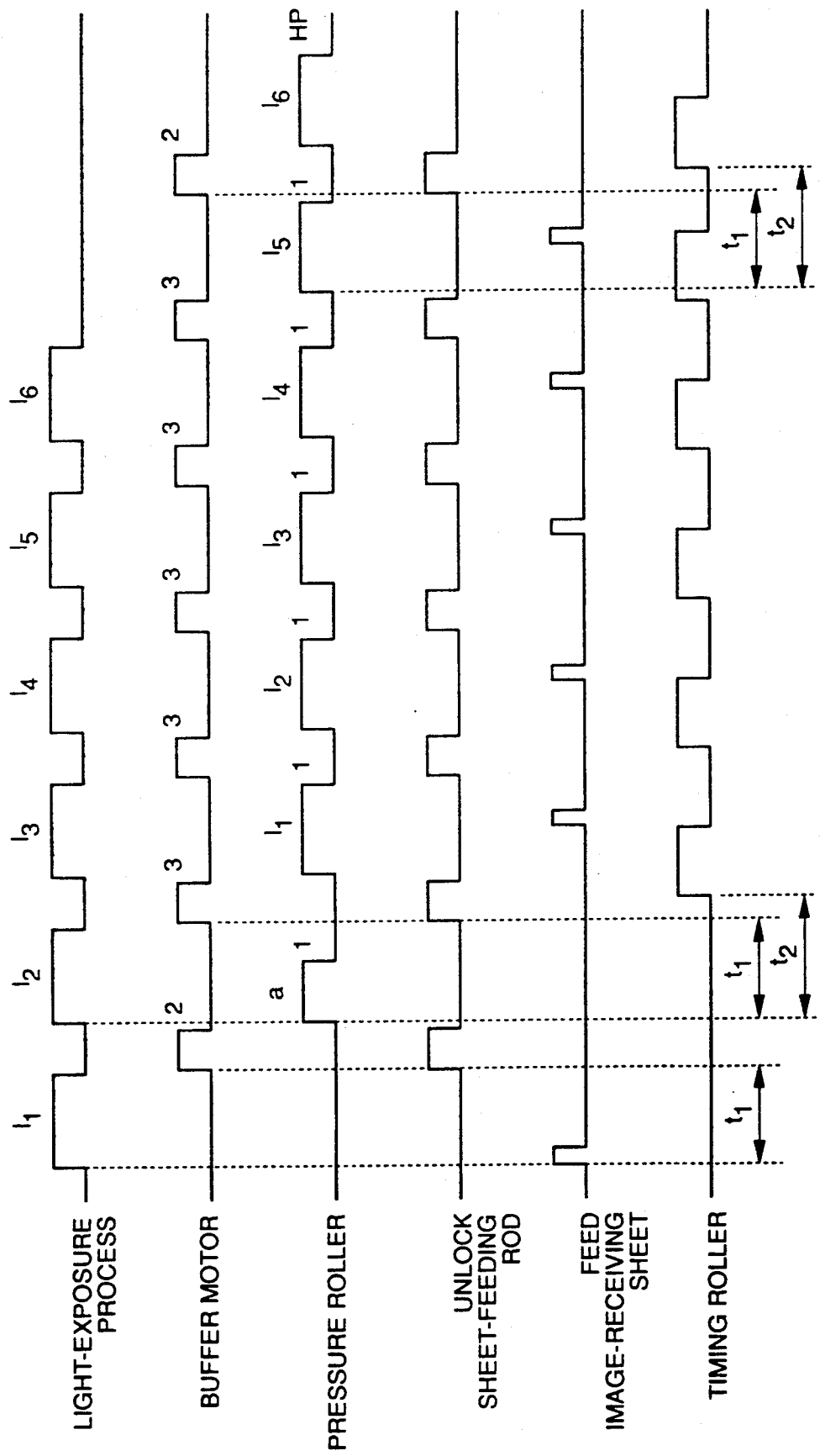
FIG._2B

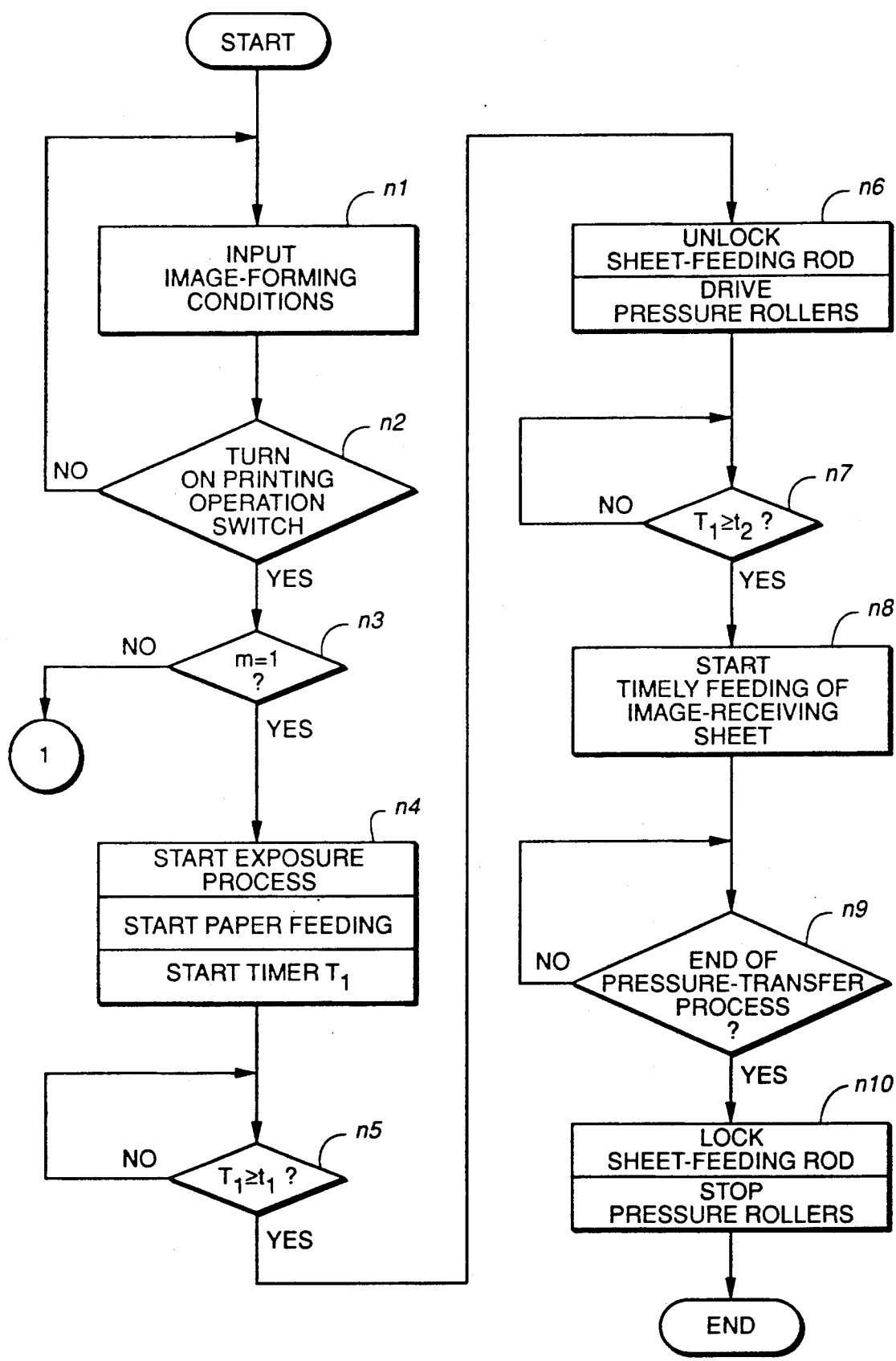
FIG._3A

FIG._3B
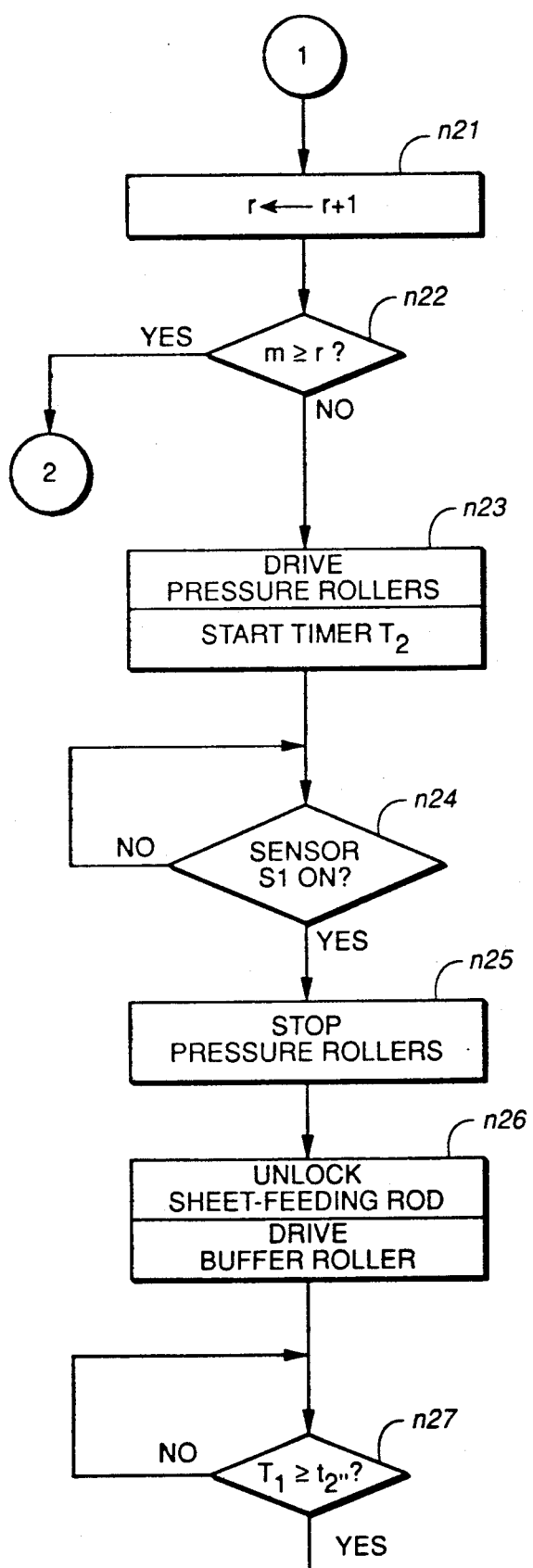
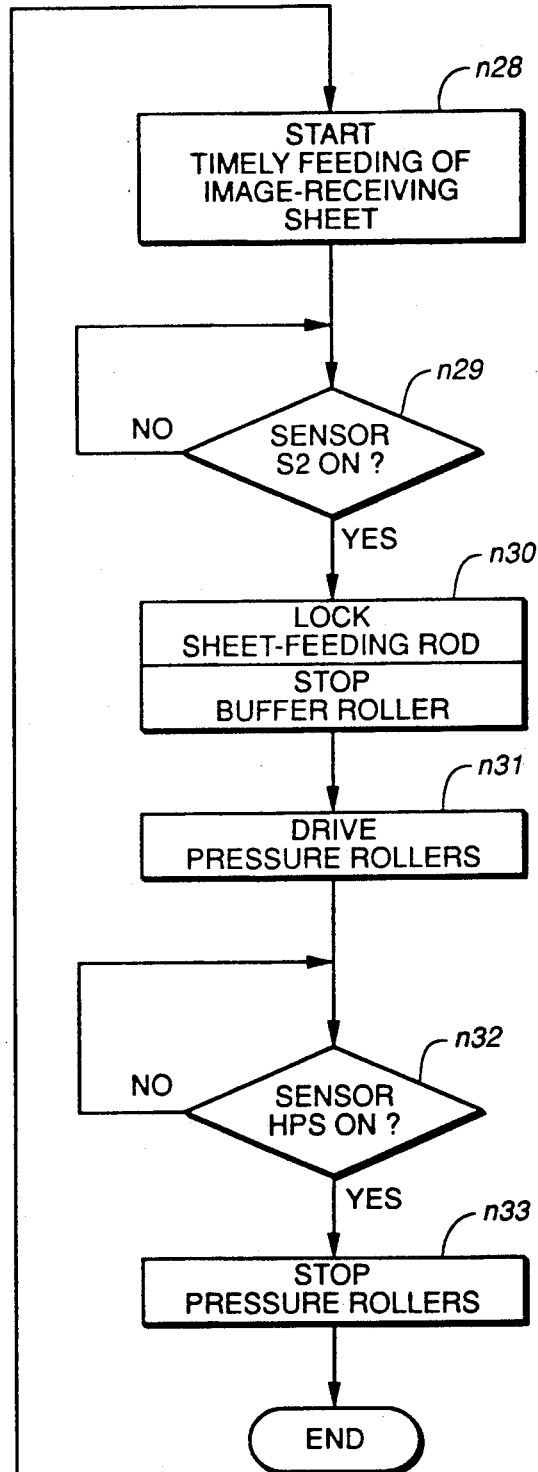

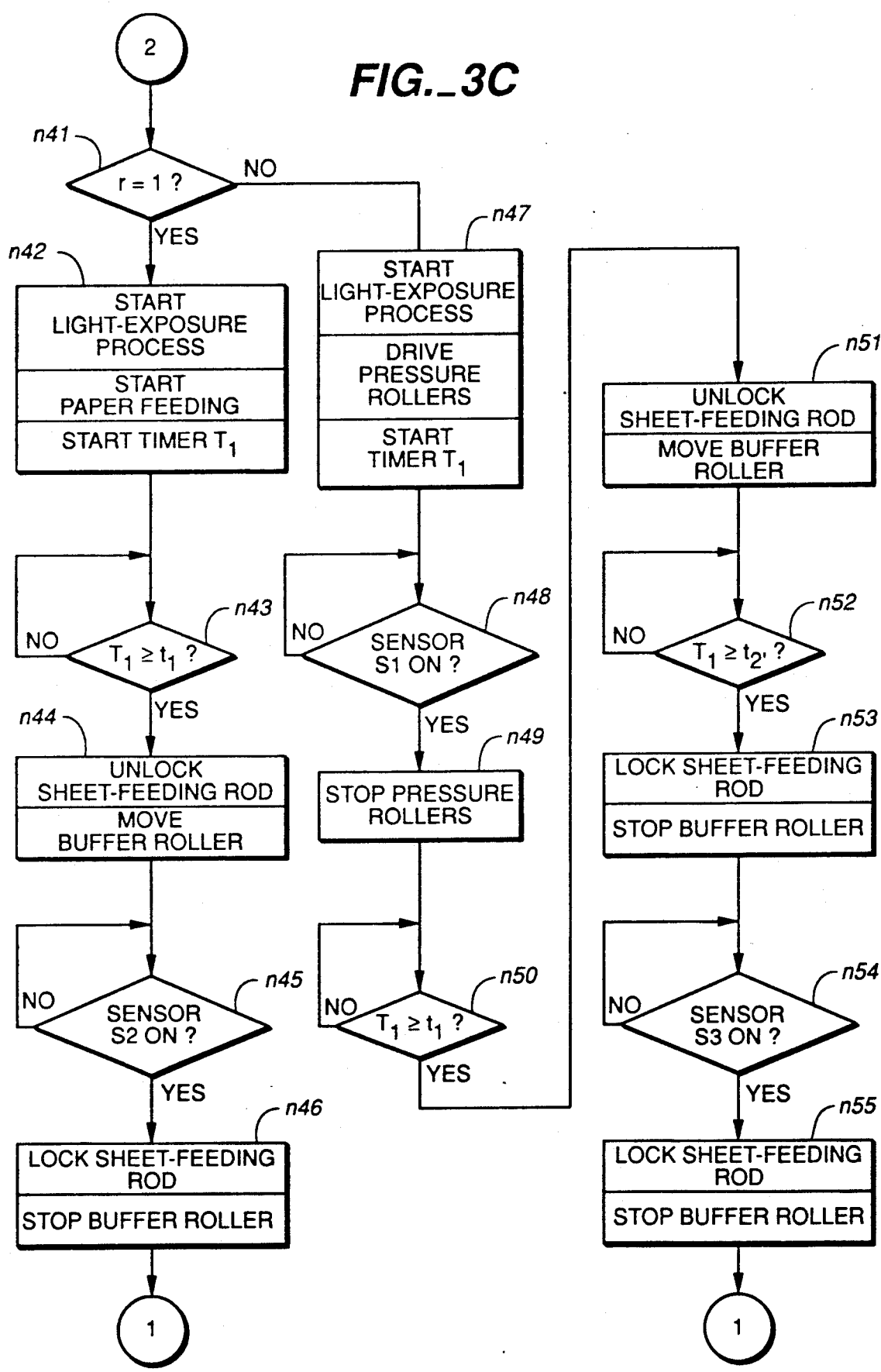
FIG._3C

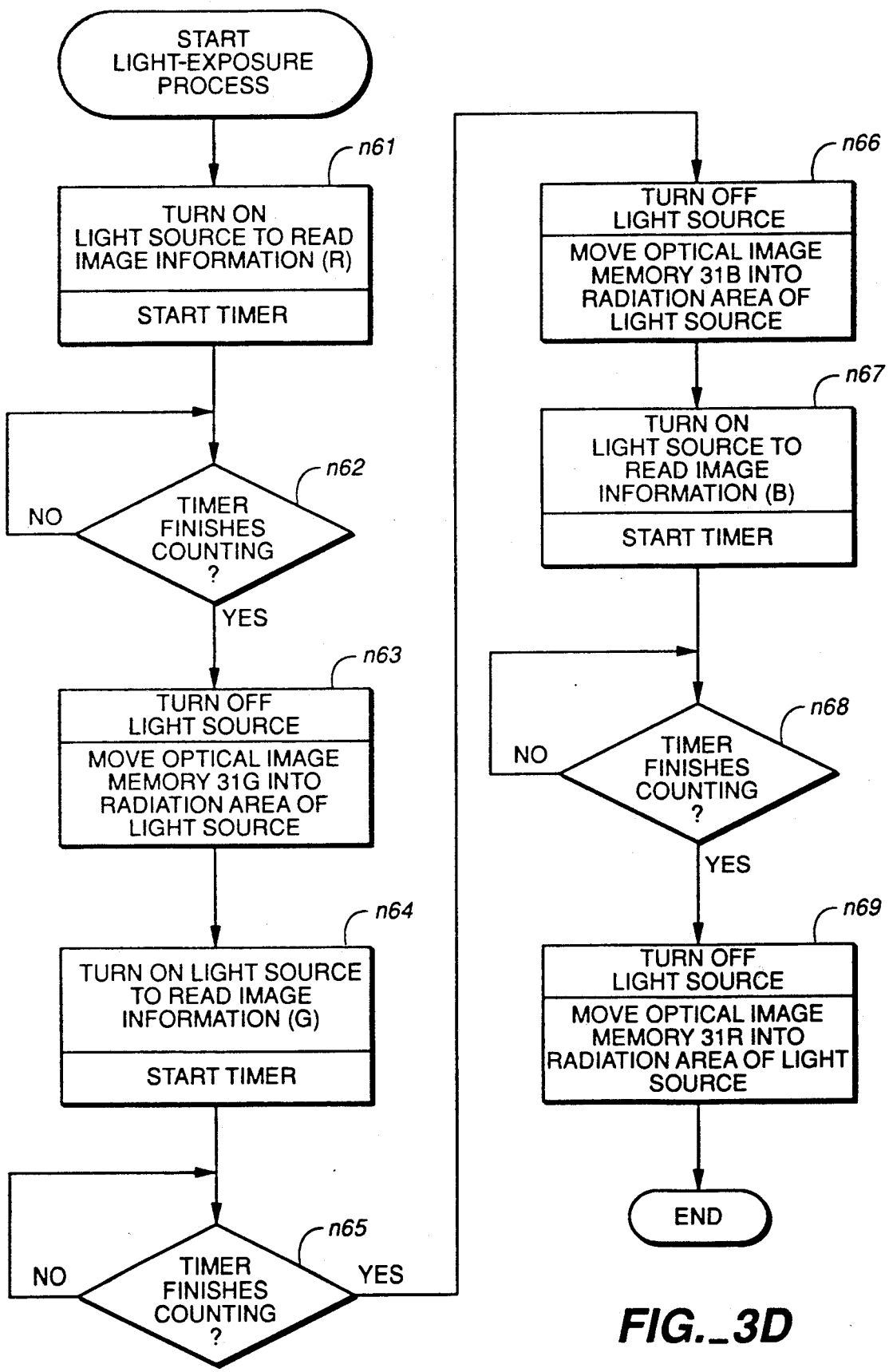
FIG._3D

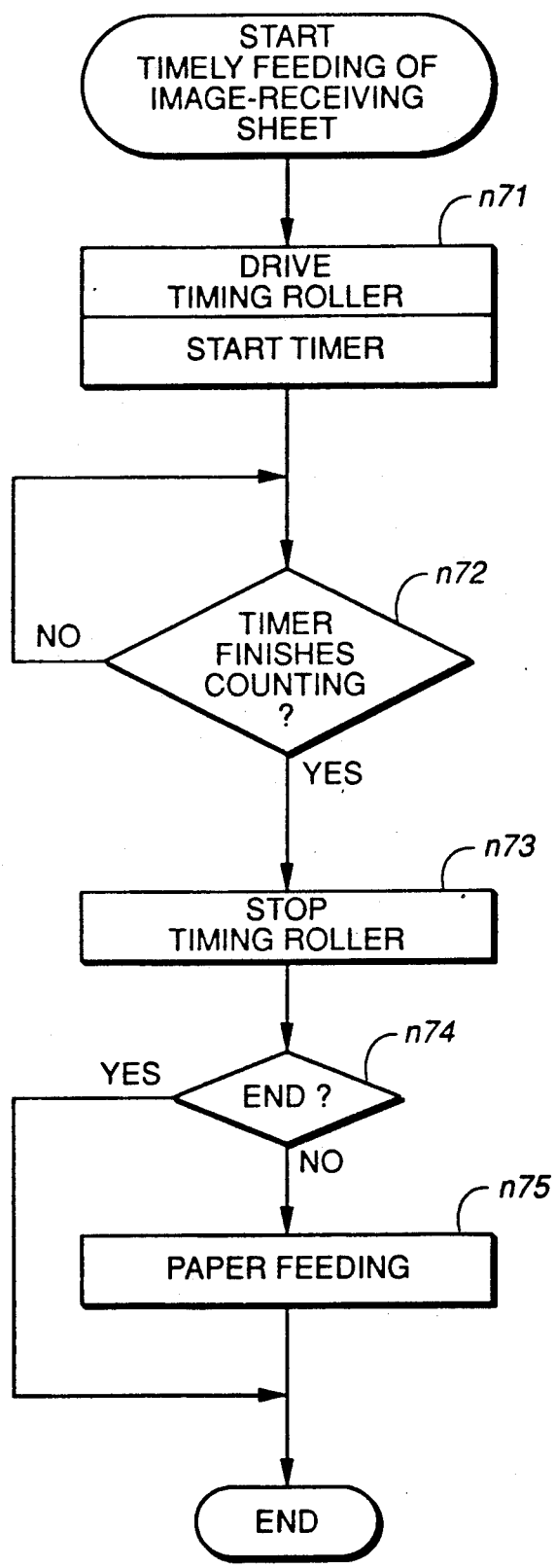
FIG._3E

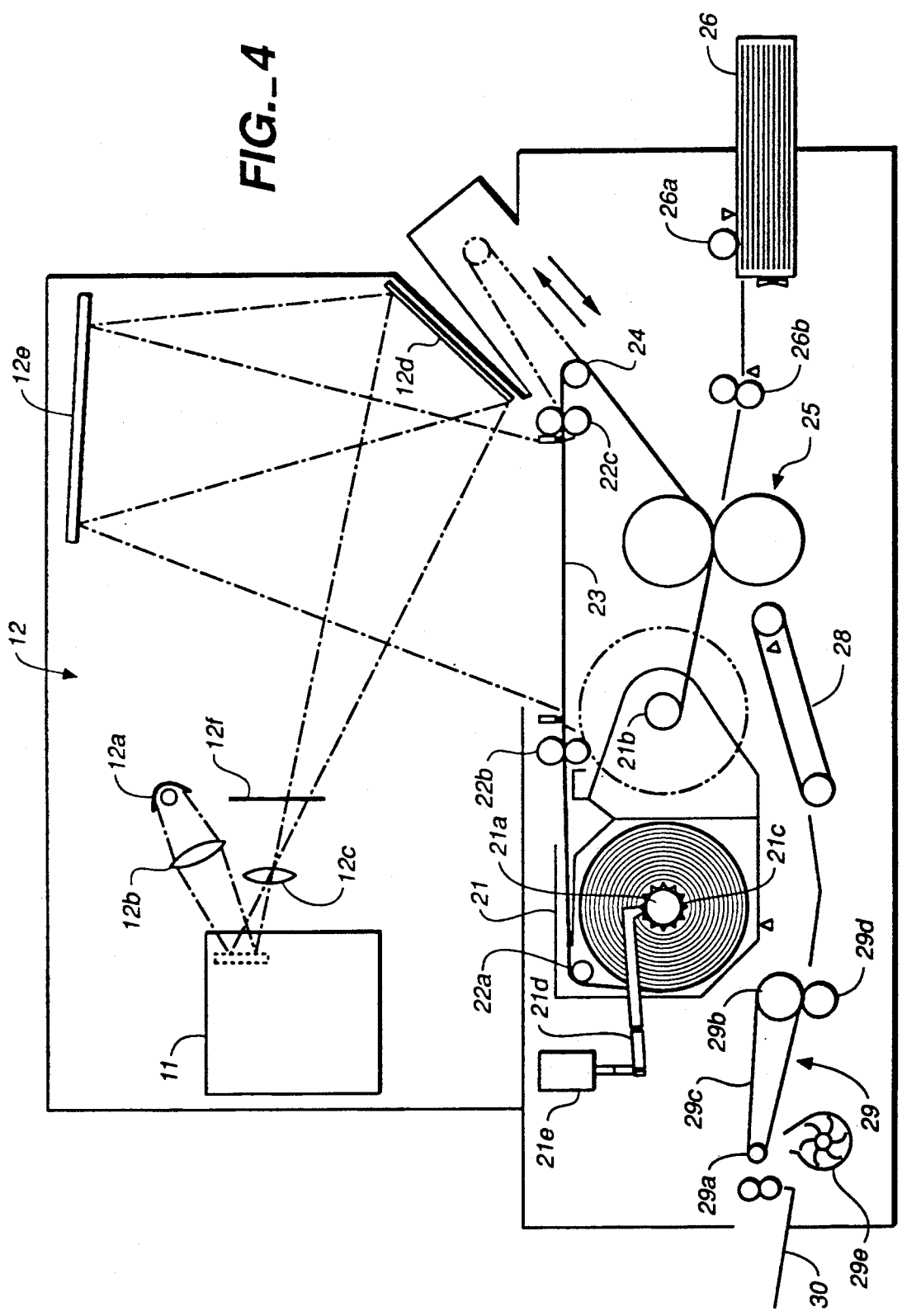

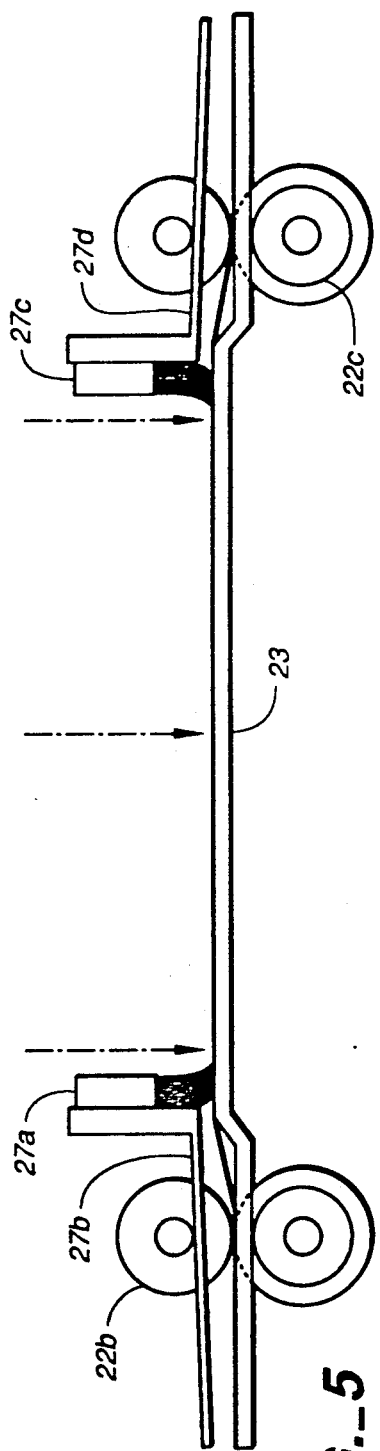
FIG._5
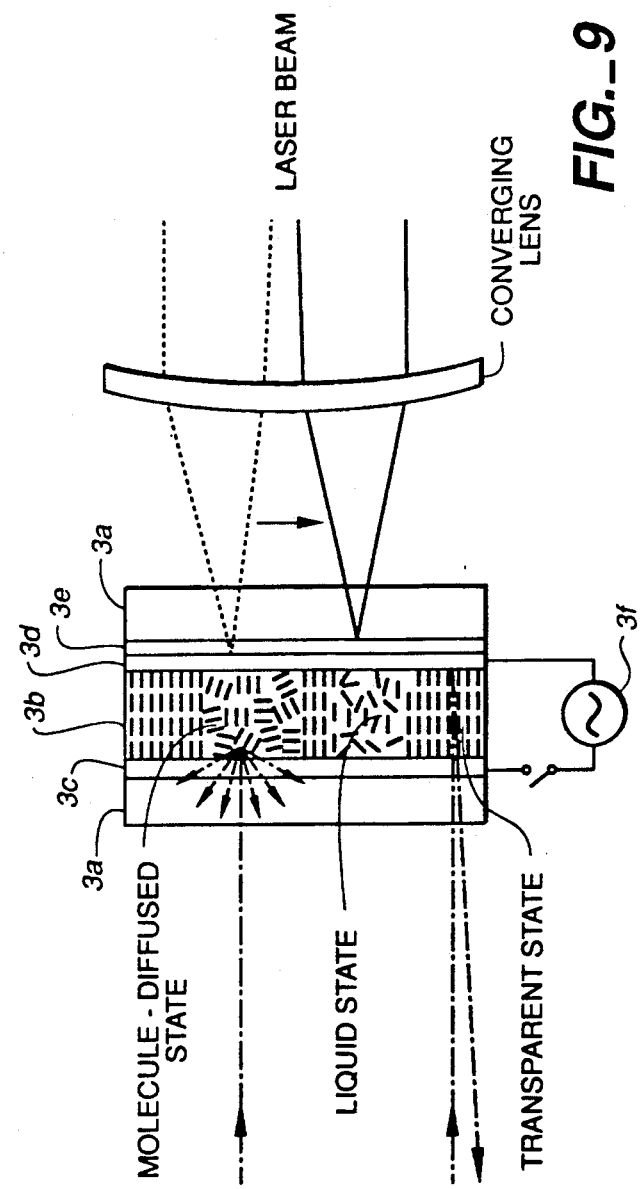
FIG._9

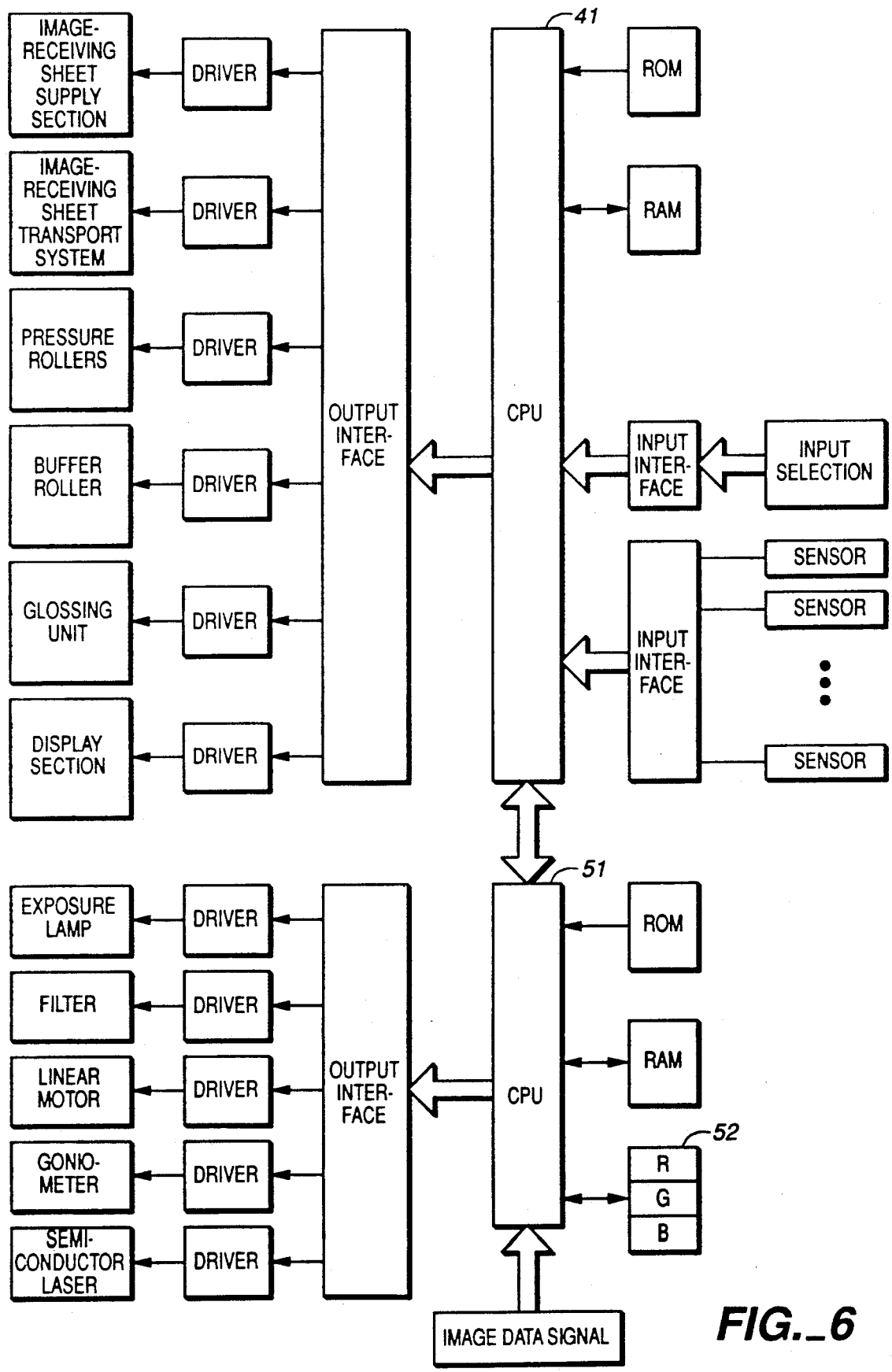
FIG._6

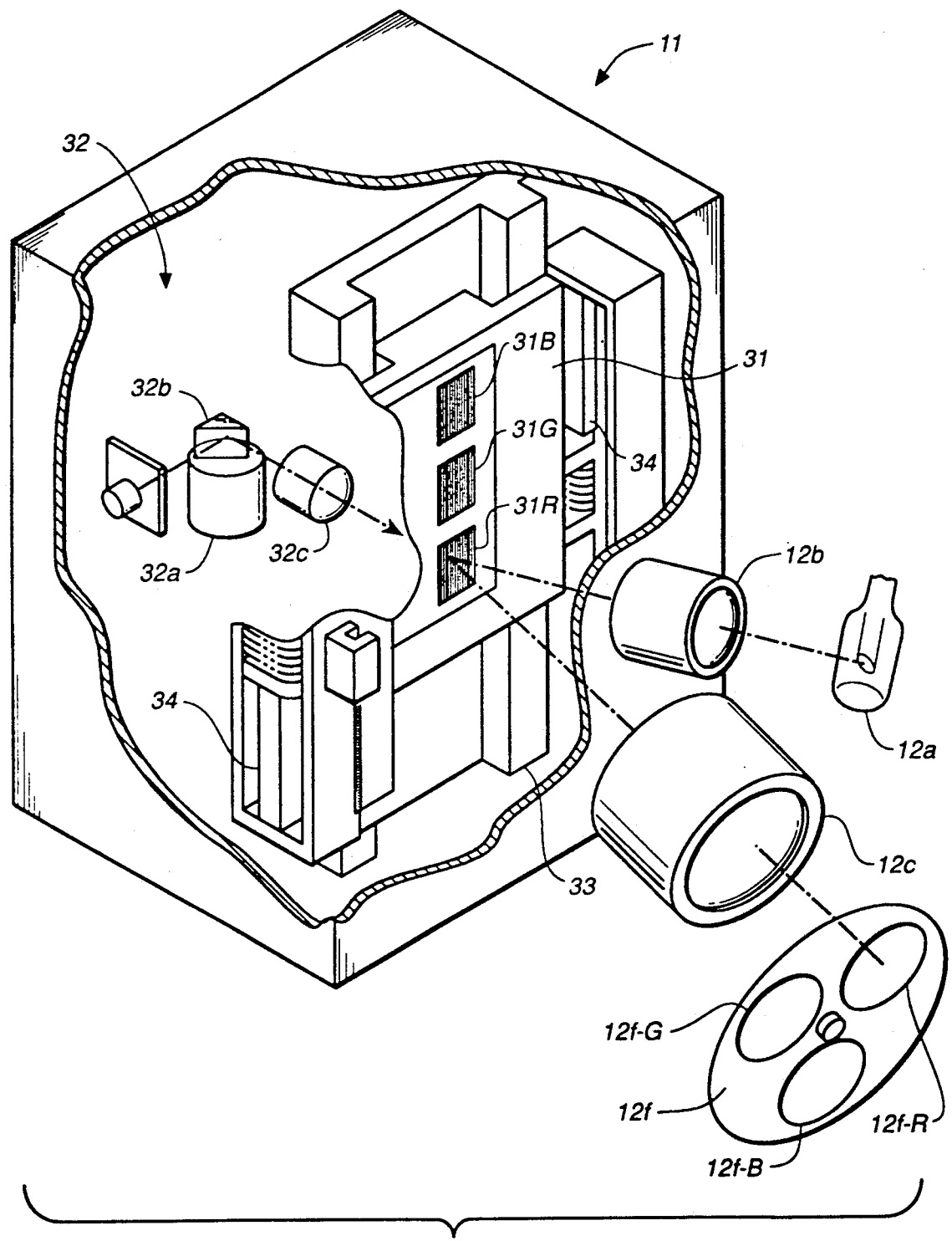
FIG._7

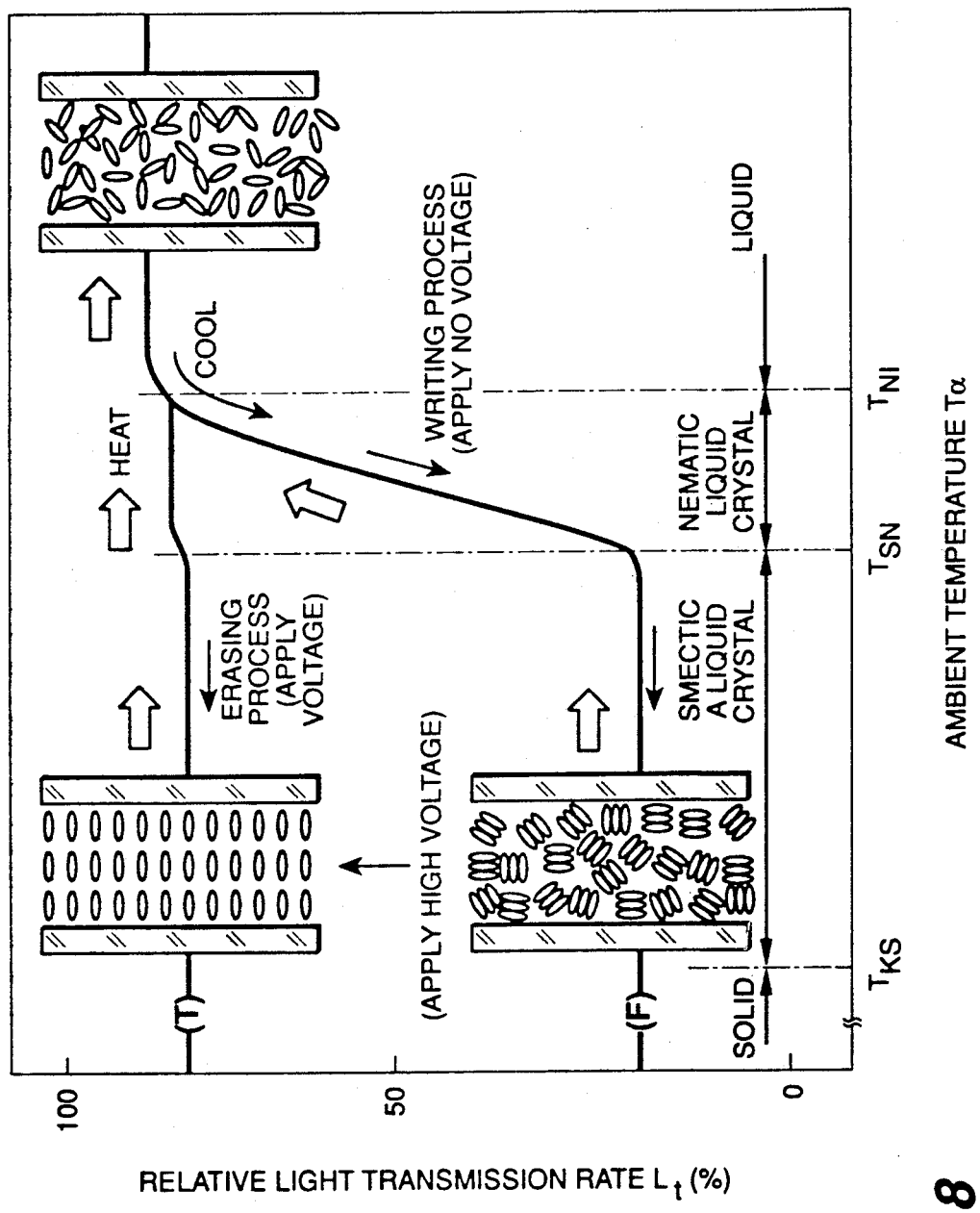
FIG._8

FIG._10A
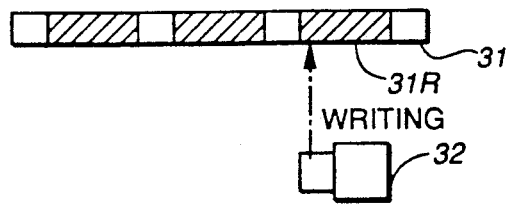
FIG._10B
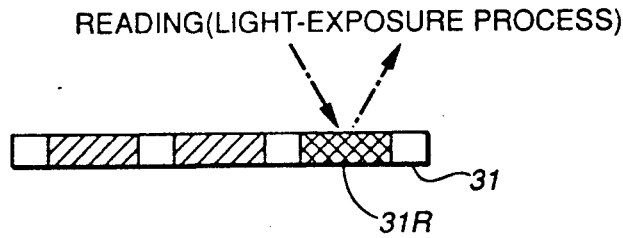
FIG._10C
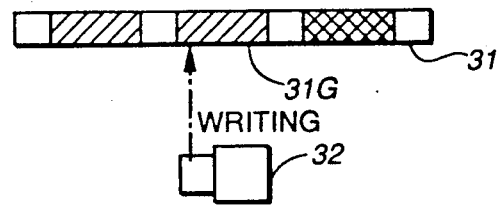
FIG._10D
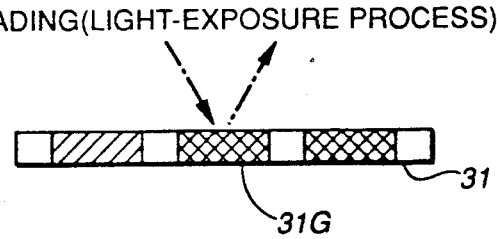
FIG._10E
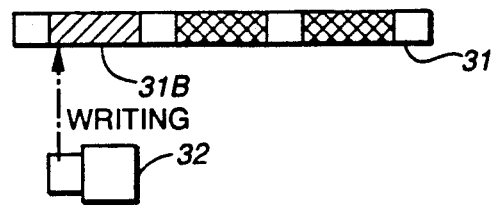
FIG._10F

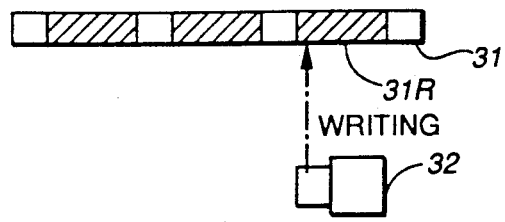
FIG. _11A
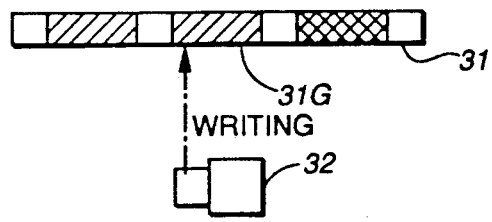
FIG. _11B
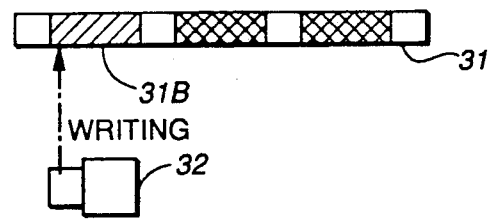
FIG. _11C
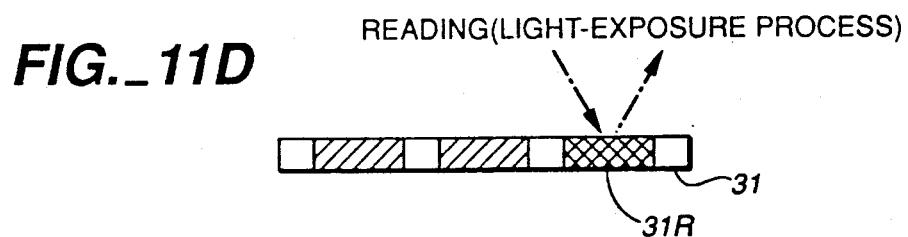
FIG. _11D
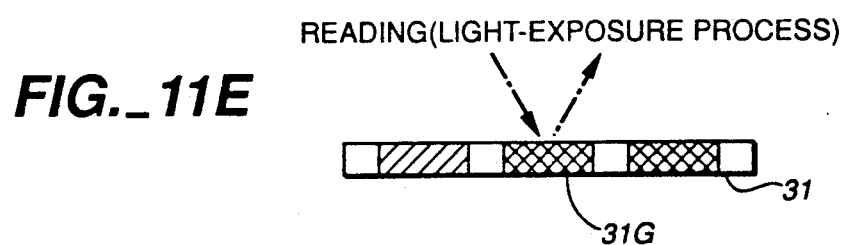
FIG. _11E
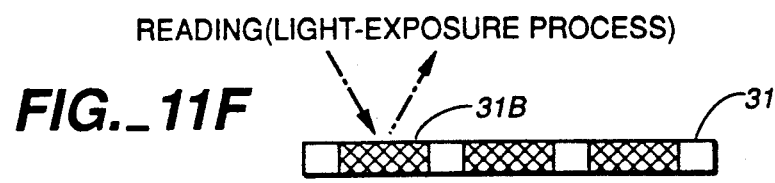
FIG. _11F

METHOD FOR THE FORMATION OF IMAGES AND AN APPARATUS FOR PERFORMING THE SAME

BACKGROUND OF THE INVENTION

1. Field of the invention

This invention relates to a method for the formation of images and an apparatus for performing the same using a photosensitive and pressure-sensitive sheet, said method and said apparatus comprising an improved sheet-transportation system.

2. Description of the prior art

A method for the formation of images using a photosensitive sheet coated with pressure-rupturable capsules made of resin containing a chromogenic material and a photosensitive material that is hardened by light has been proposed by, for example, Japanese Laid-Open Patent Publication No. 58-88739. In this method, when the photosensitive sheet is exposed to light reflected from an original image or a laser beam or the like (light-exposure process), such light selectively illuminates the photosensitive sheet so that some of the pressure-rupturable capsules thereon receive the light to be hardened while others do not receive the light and remain unchanged, resulting in a latent image on the photosensitive sheet. Thereafter, an image-receiving sheet coated with developing materials for coloring the above-mentioned chromogenic materials is pressed against the latent image of the photosensitive sheet (pressure-transfer process), allowing the unhardened pressure-rupturable capsules to rupture. This causes the chromogenic materials contained in the pressure-rupturable capsules to flow out and react with the developing materials, thus obtaining a colored image on the image-receiving sheet.

Generally, the photosensitive sheet is used in a rolled form for continuous supply into an exposure and a pressure-transfer section. The light-exposure process is carried out in the exposure section either by scanning exposure or by entire surface exposure, the entire surface exposure method whereby an entire image-forming area is exposed at once having the advantage of a shorter exposure time than the time required for the scanning exposure.

However, the entire surface exposure method requires that the photosensitive sheet remain stationary during the light-exposure process before being transported into the pressure-transfer section for the pressure-transfer process. Furthermore, because the pressure-transfer process requires a high pressure (approximately 90kg/cm$^2$), a pressure roller capable of applying a high pressure is used, and the photosensitive sheet should be transported at a low speed. Thus, when a plurality of sheets are to be printed with use of a conventional apparatus utilizing the entire surface exposure method, it is impossible to simultaneously perform the light-exposure process for an image-forming area and the pressure-transfer process for another image-forming area. Also in such an apparatus, because of the low speed pressure-transfer operation, there is no possibility of shortening the total time required for image forming processing. Furthermore, in the conventional method, when a plurality of sheets are to be printed, the pressure-transfer process for the first image-forming area of the photosensitive sheet is performed after completion of the light-exposure process for the same area, and then the same procedure is repeated for the second and subsequent image-forming areas. In such a conventional image-forming process, a relatively large portion of the photosensitive sheet between the light-exposure and pressure-transfer sections is left unused, and this unused portion is interposed between every pair of adjacent image-forming areas, thus wasting the photosensitive sheet.

Also, since the unhardened pressurerupturable capsules, as noted previously, are made to rupture by pressure, if the surface (capsule-coated side) of the photosensitive sheet remains in contact with transport rollers, etc. for a long time during the image-forming operation, the unhardened pressurerupturable capsules thereon may be flawed, resulting in black streaks and other image quality defects in a final colored image.

SUMMARY OF THE INVENTION

The method for the formation of images of this invention, which overcomes the above-discussed and numerous other disadvantages and deficiencies of the prior art, utilizing a photosensitive sheet on which a plurality of image-forming areas are successively allocated, each of said image-forming areas being transported into a light-exposure section to stop for a predetermined time to be subjected to entire surface exposure for obtaining a latent image thereon, before being conveyed into a pressure-transfer section to be pressed against an image-receiving sheet for obtaining a colored image on said image-receiving sheet; wherein said image-forming areas are, when a plurality of sheets are being printed, successively transported into said light-exposure section, and then transported into a buffer section and temporarily stored there, each of said stored image-forming areas then being transported from said buffer section into said pressure-transfer section while a predetermined one of the subsequent image-forming areas remaining stationary at said light-exposure section to be subjected to said entire surface exposure.

In a preferred embodiment, two of said image-forming areas adjacent to each other are stored in said buffer section.

In a preferred embodiment, the preceding one of said two image-forming areas stored in said buffer section is transported into said pressure-transfer section at the time when the image-forming area subsequent to the other one of said two image-forming areas is being subjected to said entire surface exposure.

In a preferred embodiment, a movable buffer is provided substantially adjacent to said light-exposure section in the sheet-transporting direction, said buffer roller being moved away from said light-exposure section to transport said image-forming area from said light-exposure section into said buffer section, and being moved back toward said light exposure section to transport said image-forming area from said buffer section into said pressure-transfer section.

The apparatus for the formation of images of this invention, utilizing a photosensitive sheet coated with pressure-rupturable capsules which is previously wound up into a roll and which has a plurality of image-forming areas successively allocated thereon, one of said image-forming areas of said photosensitive sheet being drawn out from said roll into a light-exposure section at which point it temporarily stops to be subjected to entire surface exposure to obtain a latent image thereon, and then being transported into a pressure-transfer section at which point it is pressed against an image-receiving sheet to obtain a colored image on said image-receiving sheet; wherein members that are in contact with the capsule-coated side of said photosensitive sheet are located in such a manner that they come into contact with the intermediate areas between adjacent image-forming areas at the time when one of said image-forming areas remains stationary for a predetermined time at said light-exposure section to be subjected to said entire surface exposure.

In a preferred embodiment, the members are transport rollers provided for transporting said photosensitive sheet.

In a preferred embodiment, the apparatus further comprises discharge brushes disposed adjacent to said light-exposure section for eliminating static electricity.

Thus, the invention described herein makes possible the objectives of (1) providing a method for the formation of images in which image-forming areas are successively allocated on a photosensitive sheet without large unused areas therebetween, thus permitting the effective use and preventing the wasteful use of the photosensitive sheet; (2) providing a method for the formation of images in which the light-exposure process for an image-forming area is performed simultaneously with the pressure-transfer process for one of the preceding image-forming areas so that the pressure-transfer time can be saved, resulting in a shorter period of time required for the whole image-forming operation; and (3) providing an apparatus for the formation of images in which transport rollers, etc., are located in such a way that they are in contact with narrow intermediate areas between adjacent image-forming areas of the photosensitive sheet when one of said image-forming areas temporarily stops at the light-exposure section during the light-exposure process, thereby preventing pressure-rupturable capsules coated on the photosensitive sheet from being flawed and, thus, colored image quality from being degraded.

BRIEF DESCRIPTION OF THE DRAWINGS

This invention may be better understood and its numerous objects and advantages will become apparent to those skilled in the art by reference to the accompanying drawings as follows:

FIGS. 1A to 1G are diagrams showing respective steps of the transportation of the photosensitive sheet in an apparatus for the formation of images of the invention.

FIGS. 2A and 2B are timing charts for the image forming operation in the apparatus of the invention, illustrating a single printing operation and a multiple printing operation, respectively.

FIGS. 3A to 3E are flowcharts illustrating the procedure of the image forming operation in the apparatus of the invention.

FIG. 4 is a front sectional view of the apparatus for the formation of images of the invention.

FIG. 5 is an enlarged view showing an exposure plate and its adjacent parts of the apparatus shown in FIG. 4.

FIG. 6 is a block diagram of a control system of the apparatus of the invention.

FIG. 7 is a perspective view showing an optical system of the apparatus of the invention shown in FIG. 4.

FIGS. 8 and 9 are diagrams illustrating the characteristics and construction of an optical image memory of the optical system shown in FIG. 7.

FIGS. 10A to 10F are diagrams showing the steps of the writing and reading operations performed on the optical image memories.

FIGS. 11A to 11F are diagrams showing the steps of another procedure of the writing and reading of image information.

DESCRIPTION OF THE PREFERRED EMBODIMENTS

The following description deals with an apparatus for the formation of images of the invention, in which a full-color compatible photosensitive sheet is used and the light reflected from each of three optical image memories is projected onto a specified image-forming area on the photosensitive sheet.

The full-color compatible photosensitive sheet, as disclosed for example in Japanese Laid-Open Patent Application No. 59-30537, is formed from a resin such as a polyester or the like, and coated with three kinds of uniformly dispersed pressure-rupturable capsules, each corresponding to one of three primary colors. The three kinds of pressure-rupturable capsules are: (1) C capsules comprising a resin capsule which contains a photosensitive material that is hardened by light with wavelengths in the red region of light and a chromogenic material that gives cyan color by reacting with a developing material (coated on an image-receiving sheet later described); (2) M capsules comprising a resin capsule which contains a photosensitive material that is hardened by light with wavelengths in the green region of light and a chromogenic material that gives magenta color by reacting with the developing material; and (3) Y capsules comprising a resin capsule which contains a photosensitive material that is hardened by light with wavelengths in the blue region of light and a chromogenic material that gives yellow color by reacting with the developing material. Thus, when these capsules receive three kinds of light each with wavelengths in one of the red, green, and blue regions of light, the C, M, and Y capsules are hardened, respectively, in response to each kind of light. When the photosensitive sheet is exposed to three kinds of image forming light (i.e., image-information light that contains the information of an image to be formed) each having wavelengths of one of the red, green, and blue region of light, the C, M, and Y capsules are selectively illuminated with their respective light in accordance with the information of the image to be formed, so that some of the pressure rupturable capsules receive the light and become hardened and others do not receive the light and remain unchanged. As a result, a latent image that consists of hardened C, M, and Y capsules and unhardened C, M, Y capsules is formed on the photosensitive sheet.

The image-receiving sheet is coated with a thermoplastic material and the above-mentioned developing material that is used to color the chromogenic material enclosed in the C, M, and Y capsules. The chromogenic material and the developing material are, for example, leuco dyes and acids that color the dyes (e.g., Japanese Laid-Open Patent Publication No. 588739).

When the photosensitive sheet with a latent image formed thereon is pressed against the image-receiving sheet, unhardened pressure-rupturable capsules rupture, causing chromogenic materials enclosed therein to flow out and give colors through reaction with the developing materials on the image-receiving sheet, thus forming a colored image on the image-receiving sheet.

General construction of an apparatus for the formation of images

FIG. 4 shows an apparatus for the formation of full-color images that is used in a method of the invention.

An optical system is disposed in the upper part of the body of the apparatus, the optical system including an image writing device 11 and an image reading device 12. The image writing device 11 is provided, as described below, with optical image memories and a laser unit for writing image information into each of the optical image memories. A laser beam is projected onto one side of each optical image memory for writing the image information thereinto, and light is projected onto the other side thereof for reading out the image information therefrom. The image reading device 12 comprises a light source 12a, lenses 12b and 12c, mirrors 12d and 12e, and a color separation filter 12f. Image information is written into the optical image memories by means of the image writing device 11, and the image information is read out in the form of reflected light by means of the image reading device 12 for illuminating a photosensitive sheet to obtain a latent image thereon. The optical system will be described in detail later.

An image forming process section is disposed in the lower part of the body of the apparatus. In the center of the lower part of the body is mounted a cartridge 21 in such a way as to be removable from the body. The cartridge 21 includes a sheet-feeding rod 21a and a take up rod 21b, the sheet-feeding rod 21a being loaded with a new photosensitive sheet in a rolled form thereon. The photosensitive sheet is fullcolor compatible as previously mentioned. The photosensitive sheet is drawn out from the sheet-feeding rod 21a, and directed through transport rollers 22a and 22b, an exposure plate 23, a pair of transport rollers 22c, a buffer roller 24, and a pair of pressure rollers 25, before being wound around the take up rod 21b. On the exposure plate 23, the photosensitive sheet is exposed to image forming light from the image reading device 12 so as to obtain a latent image thereon. An entire surface exposure method being employed, the photosensitive sheet is made to stay stationary on the exposure plate 23 after being delivered in a predetermined length from the cartridge 21. At this stage, the light reflected from the entire surface of each optical image memory is projected onto the entire image-forming area, thereby selectively illuminating the image-forming area. As a result, some of the pressure-rupturable capsules receive the light to be hardened and others do not receive the light and remain unchanged, resulting in a latent image. The entire surface exposure thus performed helps to shorten the total exposure time as compared with exposure by scanning.

The photosensitive sheet with the latent image formed thereon is pressed against the image-receiving sheet by means of the pressure rollers 25, which causes the unhardened pressure-rupturable capsules to rupture, thereby allowing the chromogenic materials therein to flow out onto the image-receiving sheet. The image-receiving sheet is delivered from a paper cassette 26 mounted on the right side of the body of the apparatus. The buffer roller 24 is operated for simultaneously performing the light-exposure and pressure-transfer operations; this operation will be described later.

The image-receiving sheet accommodated in the paper cassette 26 is delivered by means of a paper feed roller 26a till it temporarily stops at a timing roller 26b. The timing roller 26b is then started for rotation at a predetermined timing to feed the image-receiving sheet so that the image-receiving sheet is matched with the latent image of the photosensitive sheet for being pressed together by the pressure rollers 25. This causes the unhardened pressure-rupturable capsules of the latent image on the photosensitive sheet to rupture, and thus the chromogenic materials enclosed therein to flow out onto the image-receiving sheet and react with the developing materials, thereby forming a colored image on the image-receiving sheet. Thereafter, the photosensitive sheet is taken up on the take up rod 21b, while the image-receiving sheet is transported by a transport belt 28 and then through a glossing unit 29 before being discharged out of the body onto a paper-receiving tray 30.

The glossing unit 29 includes a glossing belt 29c applied between rollers 29a and 29b, a pressure roller 29d which is pressed against the roller 29b with the glossing belt 29c interposed therebetween, and a fan 29e facing the roller 29a. A heat source such as a halogen lamp is provided inside the roller 29b, the surface temperature thereof being kept between 100 and 200 degrees Centigrade. The image-receiving sheet discharged from the pressure rollers 25 is transported along the glossing belt 29c. The image-receiving sheet is heated while being pressed between the roller 29b and the pressure roller 29d, thereby causing the thermoplastic material coated on the image-receiving sheet to soften and cover the colored image surface, which is smoothened to give glossiness to the colored image (Japanese Laid-Open Patent Publication No. 60-259490). Also, the heating accelerates the coloring reaction between the chromogenic materials and the developing materials (Japanese Laid-Open Patent Publication No. 61-24495), thus giving clearness to the image.

Provided on one end of the sheet-feeding rod 21a of the photosensitive sheet is a sawtooth-like engaging portion with which an actuator 21d engages. The actuator 21d is made to swing by the action of a solenoid 21e. When the solenoid 21e is de-energized, the actuator 21d swings to be engaged with the sheetfeeding rod 21a, so that the sheet-feeding rod 21a is locked to prevent the photosensitive sheet from being drawn out from the cartridge 21. When the solenoid 21e is energized, the actuator 21d is disengaged to unlock the sheet-feeding rod 21a to allow the photosensitive sheet to be drawn out from the cartridge 21.

FIG. 5 is an enlarged view of the exposure plate 23, on the top surface of which are disposed discharge brushes 27a and 27c. The discharge brush 27a is disposed upright on the upstream end (viewed in terms of the transporting direction of the photosensitive sheet) of the exposure plate 23, and the discharge brush 27c is disposed upright on the downstream end thereof. The discharge brushes 27a and 27c are respectively fixed to paper guides 27b and 27d disposed above the photosensitive sheet. The discharge brushes 27a and 27c eliminate any static electricity generated through friction between the photosensitive sheet with the exposure plate 23 during the transportation of the photosensitive sheet. The discharge brushes 27a and 27c also block stray light from entering the center portion of the exposure plate 23, thus preventing exposure of the photosensitive sheet to stray light.

The transport rollers 22b and 22c consist of upper rollers and lower rollers. The upper rollers are in contact with the capsule-coated side of the photosensitive sheet. When an image-forming area of the photosensitive sheet stops for a predetermined period of time to be subjected to the light-exposure process, the upper rollers are in contact with the pressurerupturable capsules on the photosensitive sheet for the same period. This may cause the pressure-rupturable capsules in contact with the upper transport rollers to be flawed. If the portions of the photosensitive sheet in contact with the transport rollers 22b and 22c correspond to imageforming areas, the flawed capsules may cause the degradation of final colored images. Therefore, in an apparatus for the formation of images of the invention, the transport rollers 22b and 22c are disposed in such a way that they are positioned spacially apart from each other by approximately some integer times the length of a single image forming area. In the apparatus of this example, they are spaced apart from each other by the same length as a single image-forming area. Thus, when the imageforming area to be exposed is made to remain stationary on the exposure plate 23, the transport rollers 22b and 22c are in contact with narrow intermediate areas between the present image-forming area and its adjacent image-forming areas. (This intermediate portion between adjacent image-forming areas is hereinafter referred to as a non-image area.) As a result, no pressure-rupturable capsules on the image-forming areas are flawed, preventing the final colored image from deteriorating. In this example, there are only two members (transport rollers 22b and 22c) that are in contact with the capsule-coated side of the photosensitive sheet. But more than two members in contact with the capsule-coated side can be provided. In this case also, the members are located so as to be spaced apart from one another by approximately some integer times the length of a single image-forming area.

FIG. 6 is a block diagram of the control system of the apparatus for the formation of images. The apparatus is provided with two CPU's 41 and 51. The CPU 41 controls the image forming process section that includes the photosensitive sheet transport system, the image-receiving sheet transport system, the glossing unit, etc., as well as the input/output to and from an operation section (input section), and thence controls the buffer roller 24, the pressure rollers 25, etc., in accordance with the number of sheets to be printed, or other image forming conditions that are input to the operation section. The CPU 51 is provided to control the optical system. Image data is input to the CPU 51 from a scanner, computer, etc., which are peripheral devices to the apparatus for the formation of images. The image data consists of digital data separated into three primary color components, red (R), green (G), and blue (B), which, under the control of the CPU 51, are stored as image information in an R area, a G area, and a B area of an image memory 52, respectively. Then, in the image writing operation, each of the stored image information date corresponding to R, G, and B is written into the respective optical image memories using the image writing device 11 that includes a semiconductor laser unit.

Construction of the optical system

FIG. 7 shows the image device 11 and its adjacent parts.

The image writing device 11 includes three optical image memories 31R, 31G, and 31B. Each of the optical image memories 31R, 31G, and 31B is formed for example from a smectic liquid crystal device.

(1) Description of the smectic liquid crystal device

FIG. 8 shows the thermoelectro-optic characteristics of the smectic liquid crystal device.

A smectic liquid crystal device comprises two glass substrates between which smectic A-type liquid crystals having positive dielectric anisotropy are sandwiched. The electrode surface on the inner side of each substrate is appropriately treated so that the liquid crystal molecules are aligned perpendicular to the plane of the substrate (state (T) as shown in upper left in FIG. 8). In this state, the device is transparent. When the entire liquid crystal device is slowly heated, the transparency of the device slowly increases and then reaches saturation (as shown in upper right in FIG. 8). In this state, the molecular alignment in the liquid crystal is completely random. The liquid is now in an isotropic state, and not a liquid crystal. Next, when this liquid is slowly cooled, the following two stable states are obtained depending on the way it is cooled.

A) When the device is cooled without applying voltage between the electrodes, the molecules in the device align partly in a smectic state (focal conic). As a result, the device turns to be opaque (state (F) as shown in lower left in the FIG. 8).

B) On the other hand, when the device is cooled while applying a sufficiently great high-frequency voltage between the electrodes, the liquid crystal molecules come to be aligned perpendicular to the plane of the substrates, thus returning to the original smectic A-type liquid crystal state. That is, the device becomes transparent. This is because the liquid crystal molecules have positive dielectric anisotropy and therefore align parallel to the applied electric field.

The above states described in A) and B) are retained as long as required even after removal of the voltage applied between the electrodes, provided that the ambient temperature of the liquid crystal device is controlled so as not to exceed the phase transition temperature $T_{NI}$.

There are two ways to bring the device from the state (F) (opaque state) back to the state (T) (transparent state) shown in FIG. 8.

C) The liquid crystal device is reheated till the liquid crystals turn into liquid, and then cooled while applying a sufficiently high voltage between the electrodes.

D) An extremely high voltage is applied between the electrodes to forcibly bring the device from the state (F) back to the state (T). In this case, the liquid crystal device must be kept at the same temperature as the ambient temperature.

Using the above characteristics, it is possible to write and erase optically readable (transparent or opaque) image information in a smectic liquid crystal device through selective application of voltage and heat. Voltage can be selectively applied to any specified pixels by scanning matrix electrodes arranged on the glass substrates, while heat can be applied to any specified pixels using a laser beam.

FIG. 9 is a diagram showing the construction of any of the above smectic liquid crystal devices (optical image memories) 31R, 31G, and 31B. The liquid crystal device comprises two glass substrates 3a, a smectic liquid crystal layer 3b sandwiched therebetween, a transparent electrode 3c disposed on the left side of the liquid crystal layer 3b, an aluminum reflective film 3d disposed on the right side of the liquid crystal layer 3b, and a $Cr_2O_3$ absorption film 3e, which is a laser beam absorption film, disposed on the right side of the aluminum reflective film 3d. The transparent electrode 3c and the aluminum reflective film 3d constitute matrix electrodes as used in a known liquid crystal display, one of which serves as the scanning electrode and the other as the signal electrode, the electrodes being scanned by a high-frequency voltage 3f. Thus, it is possible to make the portion where the scanning and signal electrodes intersect function as a pixel, and to apply an electric field to any selected pixel by controlling the signal wave applied to the electrodes. Disposed on the right side of the liquid crystal device are a semiconductor laser unit and a converging lens for heating a selected pixel with a laser beam. It is therefore possible to heat any selected pixel by scanning with the laser beam and by turning on and off the laser beam.

When light is projected onto the liquid crystal device from the left side (the reading side), the light is not reflected by the portion of the device where the liquid crystal layer 3b is in a molecular-diffused state (opaque state), but the light is reflected by the portion where it is in a liquid or transparent state because the light is transmitted through to the aluminum reflective film 3d and is reflected by this reflective film 3d.

(2) Description of the image writing unit and its adjacent parts

Referring to FIG. 7, the image writing device 11 includes a semiconductor laser unit 32. The semiconductor laser unit 32 receives image information stored in the image memory 52, and emits a laser beam, the on-and-off operation of which is controlled according to the image information. The laser beam is reflected by a mirror 32b provided on a goniometer 32a, passes through a pickup lens (converging lens) 32c having a focusing function, and is projected onto one of the optical image memories (liquid crystal devices) 31R, 31G, or 31B. The goniometer 32a is used for the scanning operation of the laser beam.

The light source 12a, the lenses 12b and 12c, and the color separation filter 12f (a part of the image reading device) are disposed on the right side of the optical image memories 31R, 31G, and 31B. The color separation filter 12f is a disk-shaped frame having an R filter 12f-R that transmits the light with wavelengths in the red region of light, a G filter 12f-G that transmits the light with wavelengths in the green region of light, and a B filter 12f-B that transmits the light with wavelengths in the blue region of light. By rotating the color separation filter 12f, one of the three filters is positioned to face the light reflected from one of the optical image memories. In practice, the R filter 12f-R faces the optical image memory 31R, the G filter 12f-G faces the optical image memory 31G, and the B filter 12f-B faces the optical image memory 31B. Therefore, when reading the image information stored in the optical image memory 31R, for example, only the light with wavelengths in the red region of the light reflected therefrom is transmitted through the color separation filter 12f for illuminating the photosensitive sheet.

The optical image memories 31R, 31G, and 31B are fixed to a support block 31 which is movable along a rail 33.

A linear motor 34 is provided for moving the support block 31 along the rail 33, and by controlling this motor, either one of the three optical image memories 31R, 31G, or 31B is positioned to face the radiation area of the semiconductor laser unit 32 and the light source 12a. The semiconductor laser unit 32 and the light source 12a are disposed opposite each other, both emitting a beam of light toward the same area. In FIG. 7, the optical image memory 31R is positioned to face the radiation area of the semiconductor laser unit 32 and the light source 12a.

Image information written in the optical image memories 31R, 31G, and 31B will be retained for a long period of time. Therefore, the image information once written into any optical image memory using the semiconductor laser unit 32 can be extracted as many times as desired using the light source 12a (of the image reading device).

(3) Description of the operation of the optical system

Image information is written into and read from the optical image memories 31R, 31G, and 31B in the sequence shown in FIGS. 10A to 10F or FIGS. 11A to 11F. FIGS. 10A to 10F show the method in which writing and reading operations are alternately performed on each of the three optical image memories. This method is conveniently used for image forming for a single sheet (a single printing operation). On the other hand, FIGS. 11A to 11F show the method in which image information is first written into all the three optical image memories, and then, the written information is sequentially read out. This method is conveniently used for image forming for a plurality of sheets (a multiple printing operation) since all images are written at first, and then read out sequentially, thus allowing the reading operation to be performed in a given cycle regardless of the writing time. Either method may be used. In either case, once the image information is written, it is possible to read it out as many times as desired without any further writing operation.

In the method shown in FIGS. 10A to 10F, the writing and reading of image information is performed in the following manner.

First, the image information stored in the R area of the image memory 52 is written into the optical image memory 31R using the semiconductor laser unit 32 as shown in FIG. 10A. Then, the optical image memory 31R is exposed to the light from the light source 12a for reading out the image information as shown in FIG. 10B. At this time, the R filter 12f-R is placed in the path of the light reflected from the optical image memory 31R so as to project light with wavelengths in the red region of the light onto the photosensitive sheet. After completion of the writing and reading of the image information stored in the R area of the image memory 52 (FIGS. 10A and 10B), the linear motor 34 is driven to move the support block 31 so that the optical image memory 31G is positioned to face the radiation area of the semiconductor laser unit 32 and the light source 12a. At the same time, the color separation filter 12f is rotated so that the G filter 12f-G comes into the path of the light reflected from the optical image memory 31G. In the same manner as the writing and reading of the image information stored in the R area, the image information stored in the G area of the image memory 52 is written into the optical image memory 31G as shown in FIG. 10C, which is then exposed to the light from the light source 12a as shown in FIG. 10D, the light reflected therefrom being projected through the G filter 12f-G onto the photosensitive sheet. Thereafter, once again, the support block 31 is moved, the color separation filter 12f is rotated, and the image information stored in the B area of the image memory 52 is written into the optical image memory 31B as shown in FIG. 10E, which is then exposed to the light from the light source 12a as shown in FIG. 10F, The light reflected therefrom being projected through the B filter 12f-B onto the photosensitive sheet.

In this way, the image information stored in the R, G, and B areas of the image memory 52 is written into the corresponding optical image memories 31R, 31G, and 31B, and the separate information is then read out in the form of light with wavelengths in one of the red, green, and blue regions of light for illuminating the photosensitive sheet, thus causing the C, M, and Y capsules on the photosensitive sheet to harden in response to the corresponding color regions of the light, thereby forming a latent image. As previously mentioned, for image forming for the second and subsequent sheets, it is not necessary to write the image information again, but the reading operations shown in FIG. 10B, FIG. 10D, and FIG. 10F are performed in that order for forming the second and subsequent latent images on the photosensitive sheet.

In the method shown in FIGS. 11A to 11F, the writing and reading of image information is performed in the following manner.

First, the image information stored in the R area of the image memory 52 is written into the optical image memory 31R using the semiconductor laser unit 32 as shown in FIG. 11A. Then, the linear motor 34 is driven to move the support block 31 so that the next optical image memory 31G is positioned to face the radiation area of the semiconductor laser unit 32 and the light source 12a, where the image information stored in the G area of the image memory 52 is written into the optical image memory 31G as shown in FIG. 11B. After that, the linear motor 34 is further driven to move the support block 31 so that the next optical image memory 31B is positioned to face the radiation area, where the image information stored in the B area of the image memory 52 is written into the optical image memory 31B as shown in FIG. 11C. After the image information has thus been written into the optical image memories 31R, 31G, and 31B, the reading of the information is performed as described below.

The support block 31 is moved to position the optical image memory 31R in the radiation area, where the optical image memory 31R is exposed to the light from the light source 12a for reading out the image information as shown in FIG. 11D. At the same time, the R filter 12f-R is placed in the path of the light reflected from the optical image memory 31R to project light with wavelengths in the red region of the light spectrum onto the photosensitive sheet. After that, the support block 31 is moved to position the optical image memory 31G in the radiation area, while the color separation filter 12f is rotated to bring the G filter 12f-G into the path of the light reflected from the optical image memory 31G. The optical image memory 31G is exposed to the light from the light source 12c as shown in FIG. 11E, the light reflected therefrom being projected through the G filter 12f-G onto the photosensitive sheet. Thereafter, the support block 31 is further moved, while the color separation filter 12f is rotated to bring the B filter 12f-B into the path of the light reflected from the optical image memory 31B. The optical image memory 31B is then exposed to light from the light source 12a as shown in FIG. 11F, the light reflected therefrom being projected through the B filter 12f-B onto the photosensitive sheet.

The photosensitive sheet is thus exposed to three kinds of light, each corresponding to one of the three primary color regions of light, thereby forming a latent image on the surface thereof. In this method, after the completion of the writing operations shown in FIGS. 11A, 11B, and 11C, only the reading operation is repeated in the order of the steps shown in FIGS. 11D, 11E, and 11F for forming the first and subsequent latent images.

The photosensitive sheet transport system and its operation (1) The construction of the photosensitive sheet transport system FIGS. 1A to 1G show the construction of the photosensitive sheet transport system, illustrating the respective steps of the transportation of the photosensitive sheet.

It is assumed here that l denotes the length of the photosensitive sheet to be positioned on the exposure plate 23 so as to be subjected to the light-exposure process. In the case of a continuous image forming operation on the photosensitive sheet, image-forming areas $l_1$, $l_2$, etc., each having the light-exposure length l, are successively allocated on the photosensitive sheet, the first latent image being on the image-forming area $l_1$, the second latent image on the image-forming area $l_2$, and so on. Nonimage areas b are disposed separating the image-forming areas $l_1$, $l_2$, etc. from one another. As previously described, since the transport rollers 22b and 22c are disposed in such a way that they are positioned spaced apart from each other by approximately some integer times the length of a single image forming area (i.e., length l), the non-image areas b are positioned at the transport rollers 22b and 22c when one of the image-forming areas is made to remain stationary on the exposure plate 23 during the light-exposure process.

It is also assumed here that a denotes the area on the photosensitive sheet that stays between the transport rollers 22c and the pressure rollers 25 at the beginning of the image forming process. Since no image is usually formed on this area, it is desirable to keep the length of a as short as possible. A nonimage area b is also disposed between the area a and the image-forming area l, and the photosensitive sheet transport system is controlled so that the transportation of the photosensitive sheet will be suspended in such a manner that this non-image area b is also positioned either at the transport rollers 22b, the transport rollers 22c, or the pressure rollers 25.

The buffer roller 24 disposed downstream of the exposure plate 23 and transport rollers 22c is movable in the directions of arrows A and B shown in FIG. 1A. A motor (not shown) is provided for this linear movement of the buffer roller 24. The buffer roller 24, usually positioned in the home position (hereinafter called the HP), moves to positions 24-1, 24-2, and 24-3, being driven by the motor. Upper right to the buffer roller 24 is a buffer section where the photosensitive sheet is transported by the buffer roller 24 moving to the positions 24-1, 24-2, and 24-3. The length of the photosensitive sheet transported into the buffer section is determined by the position of the buffer roller 24, the length being approximately equal to the image-forming area (light-exposure length) l with the buffer roller 24 being at the position 24-1 as shown in FIG. 1C, and approximately double the imageforming area (light-exposure length) l with the buffer roller 24 being at the position 24-3 as shown in FIG. 1D. Sensors S1, S2, S3, and HPS are provided to detect the position of the buffer roller 24. The sensors S1, S2, S3, and HPS are activated when the buffer roller 24 comes to the positions 24-1, 24-2, 24-3, and HP, respectively.

(2) The operation of the photosensitive sheet transport system at the time of the image-forming process FIGS. 3A to 3D are flowcharts illustrating the procedure of the image-forming process. FIGS. 2A and 2B are timing charts for the image-forming process. In this example, the reading operation is performed during the light-exposure process after writing all image information into the optical image memories as shown in FIGS. 11A to 11F.

Single printing operation

When an image is formed on a single image-receiving sheet with use of the apparatus of the invention, the buffer roller 24 remains at the HP. FIG. 2A is a timing chart illustrating the single printing operation, and FIG. 3A shows the procedure thereof.

Referring to FIG. 3A, when the printing operation switch is turned on after the number m of the sheets to be printed and other image forming conditions are input in steps n1 and n2, the image forming process is started according to the number m of the sheets to be printed. When the number m is 1, i.e., a single sheet is to be printed (step n3), the process proceeds to step n4 in which the light-exposure process, paper feeding, and a timer $T_1$ are started. The "paper feeding" means the delivery of the image-receiving sheet from the paper cassette 26 by the rotation of the paper feed roller 26a, the delivered sheet being temporarily stopped at the timing roller 26b. The exposure process is controlled by the CPU 51.

The light-exposure process is performed in accordance with the procedure shown in FIG. 3D. In step n61, the optical image memory 31R is positioned to face the image reading device 12, and the light source 12a is turned on for emitting light toward the optical image memory 31R to obtain image-information light corresponding to the image information stored in the R area of the image memory 52. The image-information light is directed through the R filter 12f-R to project the image-information light with wavelengths in the red region of light onto the photosensitive sheet. When this exposure (reading) process is started in step n61, a timer is started to count a predetermined period of time required for the process. When the timer finishes counting in step n62, the light source 12a is turned off, and the support block 31 is moved to position the optical image memory 31G in the radiation area of the image reading device 12 in step n63. Then, in the same manner as above, the light source 12a is turned on to project the image-information light with wavelengths in the green region of light onto the photosensitive sheet for a predetermined period of time, after which the light source 12a is turned off, and the support block 31 is moved to position the optical image memory 31B in the radiation area of the image reading device 12 (steps n64, n65, n66). Once again, the light source 12a is turned on to project the image-information light with wavelengths in the blue region of light onto the photosensitive sheet for a predetermined period of time, after which the optical image memory 31R is positioned to face the image reading device 12 as at the start of the whole exposure operation, to complete the light-exposure process (steps n67, n68, n69).

In the above-mentioned light-exposure process, the image-forming area $l_1$ shown in FIG. 1A is exposed to the image-information light, resulting in a latent image thereon. The time needed for the exposure process is approximately $t_1$, which is counted by the timer $T_1$. After completion of the exposure process (step n5), the pressure-transfer process starts; i.e., the image-receiving sheet is pressed against the latent image formed on the image-forming area $l_1$, of the photosensitive sheet. The procedure of this pressuretransfer process will now be described. First, in step n6, the sheet-feeding rod 21c of the photosensitive sheet is unlocked (the solenoid 21e is energized), and at the same time, the pressure rollers 25 are started for rotation. Then, the photosensitive sheet, being pulled by the rotation of the pressure rollers 25, is drawn out from the cartridge 21. The photosensitive sheet is delivered out by the combined length of the areas a and $l_1$. During the delivery of the photosensitive sheet, the image-receiving sheet, which has been conveyed from the paper cassette 26 into the timing rollers 26b in the preceding paper feeding operation of the step n4, is transported into the pressure rollers 25 to be pressed against the image-forming area $l_1$ to form a colored image on the image-receiving sheet. The feeding of the image-receiving sheet is therefore started in step n8 with such timing that the image-receiving sheet is fed so as to be accurately placed on the image-forming area $l_1$ for the pressure-transfer process. The above timely feeding of the image-receiving sheet is started when the timer $T_1$ that was started at the beginning of the exposure process counts up to $t_2$ (step n7).

FIG. 3E is a flowchart illustrating the above-mentioned timely feeding of the image-receiving sheet, which is carried out by the rotation of the timing rollers 26b. In step n71, a timer starts at the same time that the timing roller 26b is started for rotation. When the time needed for the feeding of the image-receiving sheet of the length l elapses in step n72, the timing rollers 26b stop in step n73 to complete the timely feeding of the image-receiving sheet. After feeding the image-receiving sheet from the timing rollers 26b, if the feeding is not the last one (step n74), the paper feed roller 26a is again put into operation for feeding another image-receiving sheet from the paper cassette 26 in step n75. In the single printing operation, since only a single image forming process is performed, another paper feeding operation (step n75) is not performed.

Referring back to FIG. 3A, after completion of the pressure-transfer process (step n9), the sheet-feeding rod 21c of the photosensitive sheet is locked, and the pressure rollers 25 are stopped in step n10, so that the photosensitive sheet cannot be drawn out or transported any more. This is the end of the single printing operation. At this time, the next image-forming area is positioned on the exposure plate 23.

Multiple printing operation

FIG. 2B is a timing chart for a multiple printing operation, and FIGS. 3A to 3E show the procedure thereof. The following description deals with a multiple printing operation for printing 6 sheets. In the multiple printing operation, the buffer roller 24 is moved in such a way that the image-forming area with a latent image formed thereon is first drawn out into the buffer section, and then fed to the pressure rollers 25 for the pressure-transfer process while the light-exposure process is being performed on another image-forming area of the photosensitive sheet. Since the light-exposure and pressure-transfer processes are simultaneously performed, it helps to speed up the image forming operation as a whole. In FIG. 2B, $l_1$, $l_2$, etc. indicate the image-forming areas which are positioned on the exposure plate 23 to be exposed to light or which pass through the pressure rollers to be pressed against an image-receiving sheet at the time of the corresponding processes. Also, the numeral attached to the upper right corner at the end of each operating period of the buffer motor and the pressure rollers indicates the position of the buffer roller at the end of that operation (i.e., the numeral 1 denotes the position 24-1 of the buffer roller 24 shown in FIG. 1, 2 denotes the position 24-2, and 3 denotes the position 24-3).

Referring to FIG. 3A, the printing operation switch is pressed after the image forming conditions are input (steps n1, n2). If the number m of the sheets to be printed with an image is more than 1 (in step n3), the process proceeds to step n21 of FIG. 3B, in which 1 is added to the number r of the light-exposure processes that have been completed, the further process being performed according to that value.

For exposure for the first sheet which corresponds to the image-forming area $l_1$, the process proceeds from step n22 of FIG. 3B to step n41 of FIG. 3C and then to step n42, in which the light-exposure process, paper feeding, and timer $T_1$ are started. As described above, the time required for the light-exposure process (from steps n42, n61 to step n69) is $t_1$, which is counted by the timer $T_1$. In this first light-exposure process, a latent image corresponding to an original full-color image is formed on the image-forming area $l_1$ which is positioned on the exposure plate 23 as shown in FIG. 1A. At the end of the exposure (step n43), the sheet-feeding rod 21c of the photosensitive sheet is unlocked to allow the photosensitive sheet to be drawn out from the cartridge 21, while the linear movement of the buffer roller 24 is started in step n44. The buffer roller 24 travels in the direction of arrow A shown in FIG. 1B by the driving of the buffer motor till it reaches the position 24-2, where the sensor S2 is activated (step n45). When the sensor S2 is activated, the sheet-feeding rod 21c of the photosensitive sheet is locked, and the buffer roller 24 is stopped, to stop the transportation of the photosensitive sheet in step n46. At this point of time, the portion of the photosensitive sheet holding the area a and the image-forming area $l_1$ with the latent image formed thereon is positioned in the buffer section, and the next image-forming area $l_2$ is positioned on the exposure plate 23 as shown in FIG. 1B.

Thereafter, the process proceeds through steps n21, n22, and n41 to step n47 for the light-exposure process for the second sheet, which corresponds to the image-forming area $l_2$. The time required for the light-exposure process is approximately $t_1$ as described above. In the step n47, the timer $T_1$ and the light-exposure process for the image-forming area $l_2$ are started, and at the same time, the pressure rollers 25 are driven for rotation, pulling the photosensitive sheet stored in the buffer section into the pressure rollers 25. This causes the buffer roller 24 to move in the direction of arrow B into the position 24-1 as shown in FIG. 1C. Thus, at the time of the exposure for the second sheet, the area a of the photosensitive sheet is fed to the pressure rollers 25 by the rotation of the pressure rollers 25, where neither the feeding of the image-receiving sheet nor the pressure-transfer process is performed.

When the buffer roller 24 is moved in the direction of arrow B into the position 24-1 to activate the sensor S1, the rotation of the pressure rollers 25 stops (steps n48 and n49). At this point of time, the length of the photosensitive sheet equivalent to a single image-forming area (the image-forming area $l_1$) is positioned in the buffer section, as shown in FIG. 1C. After the suspension of the rotation of the pressure rollers 25, when the timer $T_1$ counts up to $t_1$ in step n50, the sheet-feeding rod 21c is unlocked and the buffer roller 24 is driven in step n51 to move in the direction of arrow A to draw out another length of the photosensitive sheet.

For the pressure-transfer process, the timely feeding of the image-receiving sheet by the rotation of the timing roller 26b must be started earlier than the pressure-transfer process starts by a given time, i.e. by the time needed for the image-receiving sheet fed by the timing roller 26b to reach the pressure rollers 25. Therefore, while another length of the photosensitive sheet is being drawn out by means of the buffer roller 24 driven in the step n51, the timely feeding of the image-receiving sheet is started for the first pressure-transfer process that will be performed in one of the succeeding steps later described. In this example, the timer $T_1$, which is started at the beginning of the exposure process for the second sheet, is also used to determine the point of time at which the timely feeding of the image-receiving sheet is started for the first pressure-transfer process. When the timer $T_1$ counts up to $t_2'$ in step n52, the timely feeding of the image-receiving sheet is started in step n53.

When the buffer roller 24, which was driven to move in the direction of arrow A in the step n51, reaches the position 24-3, the sensor S3 is activated in step n54, and the sheet-feeding rod 21c is locked and the buffer roller 24 stops in step n55, thus stopping the delivery of the photosensitive sheet. As a result, the image-forming area $l_2$ on which a latent image has been formed in the second light-exposure process is transported into the buffer section, so that the length of the photosensitive sheet equivalent to two image-forming areas ($l_1$ and $l_2$) is positioned in the buffer section, and the next (third) image-forming area $l_3$ is positioned on the exposure plate 23 for the third exposure process, as shown in FIG. 1D. (This sheet-transporting operation (steps n51, n54, n55) by which an image-forming area with a latent image just formed thereon is transported into the buffer section is hereinafter referred to as the "delivery operation".)

After the completion of the above-mentioned "delivery operation", the process proceeds again to the steps n21, n22, and n41, and back to the step n47 for the third light-exposure process for exposing the third image-forming area $l_3$.

At the time of the third light-exposure process for the image-forming area $l_3$, the image-forming area $l_1$ on which the latent image was formed in the first light-exposure process is transported from the buffer section into the pressure rollers 25 for the first pressure-transfer process (the steps n47—n49), in which the image-receiving sheet is pressed on the latent image of the image-forming area $l_1$, resulting in a colored image on the image-receiving sheet.

In this way, after the light-exposure processes for the first and second image-forming areas $l_1$ and $l_2$ are completed, the pressure-transfer process for the first image-forming area $l_1$ is performed simultaneously with the light-exposure process for the third image-forming area $l_3$. Since two image-forming areas with latent images thereon are stored in the buffer section before the simultaneous performance of the light-exposure and pressure-transfer processes, the light-exposure process for the Nth image-forming area $l_N$ (N is an integer of 3 or more)

is performed simultaneously with the pressure-transfer process for the (N−2)th image-forming area $l_{(N-2)}$.

After the simultaneous performance of the third light-exposure process and the first pressure-transfer process is completed (step n50), the abovementioned "delivery operation" is performed again so that the image-forming areas $l_2$ and $l_3$ are positioned in the buffer section (steps n51, n54, and n55). In the meantime, the timely feeding of the image-receiving sheet for the second pressure-transfer process is started in step n53.

The above-mentioned simultaneous performance of the light-exposure and pressure-transfer processes and the "delivery operation" are alternately repeated until the sixth (last) image-forming area $l_6$ is transported into the buffer section as shown in FIG. 1E. The time required for the simultaneous lightexposure and pressure-transfer operation and the time for the "delivery operation" are both kept constant during the whole printing process.

The buffer section is thus provided adjoining the exposure plate, the photosensitive sheet that holds latent images being continuously stored in the buffer section, thus preventing the wasteful use of the photosensitive sheet. Since the light-exposure and pressure-transfer processes are simultaneously performed, while performing the delivery of the photosensitive sheet at a relatively high speed in the meantime, the above construction offers the advantage that the total image forming time is shortened. Also, because of the employment of the entire surface exposure method, the above construction offers the further advantage that the light-exposure time is shortened.

When the last "delivery operation" is performed after completion of the exposure for the specified number of image-forming areas (6 image-forming areas) (FIG. 1E), the process proceeds through steps n21 and n22 to step n23, where the pressure rollers 25 are driven for rotation, as has been done theretofore, to perform the pressure-transfer process for the image-forming area $l_5$. As a result, as shown in FIG. 1F, only the image-forming area $l_6$ holding the last latent image is stored in the buffer section. Thereafter, the area a of the photosensitive sheet to be positioned between the transport rollers 22c and the pressure rollers 25 is drawn out into the buffer section, as shown in FIG. 1G (steps n26, n29, and n30). In the meantime, the timely feeding of an image-receiving sheet is started at the specified timing (steps n27 and n28). The image-receiving sheet fed at the specified timing reaches the pressure rollers 25 at the time when the pressure rollers 25 are driven (step n31) for the pressure-transfer process for the last image-forming area $l_6$. When the buffer roller 24 reaches the HP, the sensor HPS is activated so that the rotation of the pressure rollers 25 is suspended (steps n32 and n33), to complete the last pressure-transfer process, the photosensitive sheet transport system being brought back into the original state shown in FIG. 1A.

Also as described above, in the method for the formation of images of the invention, an image-forming area, after being subjected to the entire surface exposure, is stored in the buffer section before being transported into the pressure-transfer section in the case of a multiple printing operation. Since the buffer section is disposed adjoining the exposure plate, the next image-forming area to be exposed can be allocated substantially adjacent to the image-forming area that has just been transported into the buffer section. Therefore, it is possible to allocate image forming areas almost continuously on the photosensitive sheet in the case of a multiple printing operation. Thus, the buffer roller is operated to transport the photosensitive sheet for continuous image forming processes so that the area a which is a relatively large unused portion is not interposed between the image-forming areas $l_1, l_2, \ldots$, thus permitting the effective use and preventing the wasteful use of the photosensitive sheet. Also in this method, since the light-exposure process for an image-forming area is performed simultaneously with the pressure-transfer process for one of the preceding image-forming areas, the pressure transfer time can be saved, resulting in a shorter time for the whole printing operation.

In an apparatus for the formation of images of the invention, as described above, the non-image areas interposed between adjacent image-forming areas are positioned at the transport rollers when an image-forming area of the photosensitive sheet stays for a predetermined period on the exposure plate to be subjected to the light-exposure process, thereby preventing the pressure-rupturable capsules on image-forming areas from being flawed by the transport rollers and, thus, the final image quality from being degraded.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An apparatus for the formation of images, comprising:

a photosensitive sheet coated with photosensitive and pressure-rupturable capsules on a surface thereof;

an exposure means for directing image-forming light onto an exposure area where an image-forming area of the photosensitive sheet is kept stationary, thereby allowing the capsules on the image-forming area to receive the image-forming light to form a latent image thereon;

a pressure-developing means including pressure rollers for pressurizing said capsules to rupture them, so as to develop said latent image;

a first transporting roller and a second transporting roller spaced apart from each other for transporting said photosensitive sheet wherein said first transporting roller is located in the vicinity of the upstream end of said exposure area while the second transporting roller is located in the vicinity of the downstream end of said exposure area, in the direction of the photosensitive sheet transportation and further wherein the distance between the first and second transporting rollers is equal to or an integer multiple of the length of the exposure area; and a buffer roller located between the transporting rollers and the pressure rollers, for conveying the image-forming area of the photosensitive sheet into a buffer section after the image-forming area has been exposed to the image-forming light from the exposure means, said image forming area being temporarily kept stationary in said buffer section;

wherein the buffer roller transport the photosensitive sheet in such a manner that the length of the photosensitive sheet located between the pressure-developing means and the transporting rollers is equal to or an integer multiple of the length of the exposure area when a plurality of latent images are being successively formed on the photosensitive sheet.

2. An apparatus according to claim 1, wherein the transporting rollers are in contact with the surface of the photosensitive sheet.

3. An apparatus according to claim 1, wherein two image-forming areas which have been successively exposed to the image-forming light from the exposure means are stored in said buffer section.

4. An apparatus according to claim 3, wherein the preceding one of said two image-forming areas stored in said buffer section is transported into said pressure-transfer section at the time when the image-forming area which is subsequent to the other one of said two image-forming areas is being exposed to the image-forming light from the exposure means.

* * * * *